United States Patent
Munteanu et al.

(10) Patent No.: US 8,426,722 B2
(45) Date of Patent: Apr. 23, 2013

(54) SEMICONDUCTOR GRAIN AND OXIDE LAYER FOR PHOTOVOLTAIC CELLS

(75) Inventors: Mariana R. Munteanu, Santa Clara, CA (US); Erol Girt, San Jose, CA (US)

(73) Assignee: Zetta Research and Development LLC—AQT Series, Wilmington, DE (US)

( * ) Notice: Subject to any disclaimer, the term of this patent is extended or adjusted under 35 U.S.C. 154(b) by 422 days.

(21) Appl. No.: 11/923,036

(22) Filed: Oct. 24, 2007

(65) Prior Publication Data

US 2008/0092945 A1    Apr. 24, 2008

Related U.S. Application Data

(60) Provisional application No. 60/854,226, filed on Oct. 24, 2006, provisional application No. 60/857,967, filed on Nov. 10, 2006, provisional application No. 60/859,593, filed on Nov. 17, 2006.

(51) Int. Cl.
*H01L 31/00* (2006.01)
*H01L 27/14* (2006.01)

(52) U.S. Cl.
USPC ........... 136/255; 136/261; 257/431; 257/436; 257/465; 977/712; 977/720; 977/778; 977/948; 977/954

(58) Field of Classification Search .................. 136/243, 136/258, 260, 263, 264, 255, 261; 257/292, 257/293, 431, 436, 465; 977/712, 720, 778, 977/948, 954
See application file for complete search history.

(56) References Cited

U.S. PATENT DOCUMENTS

| | | | | |
|---|---|---|---|---|
| 4,379,943 A * | 4/1983 | Yang et al. | | 136/249 |
| 4,713,493 A * | 12/1987 | Ovshinsky | | 136/249 |
| 5,252,139 A * | 10/1993 | Schmitt et al. | | 136/251 |
| 5,482,570 A | 1/1996 | Saurer et al. | | |
| 5,720,827 A * | 2/1998 | Simmons | | 136/250 |
| 5,913,986 A * | 6/1999 | Matsuyama | | 136/255 |
| 6,323,417 B1 * | 11/2001 | Gillespie et al. | | 136/262 |
| 6,902,835 B2 | 6/2005 | Hikosaka et al. | | |
| 6,995,371 B2 | 2/2006 | Garber et al. | | 250/330 |
| 7,087,831 B2 | 8/2006 | Den et al. | | 136/250 |
| 7,192,664 B1 | 3/2007 | Wu et al. | | |
| 7,226,674 B2 | 6/2007 | Koda et al. | | |
| 7,235,314 B2 | 6/2007 | Chen et al. | | |
| 7,696,429 B2 * | 4/2010 | Strobl | | 136/249 |
| 2002/0050289 A1 | 5/2002 | Wada et al. | | 136/256 |
| 2004/0003839 A1 * | 1/2004 | Curtin | | 136/250 |
| 2004/0157354 A1 * | 8/2004 | Kuriyama et al. | | 438/45 |

(Continued)

OTHER PUBLICATIONS

Wu, "A Novel Manufactuing Process for Fabricating CdS/CdTe Polycrystalline Thin-Film Solar Cells", NREL/CP-520-28368, Conference Proceeding, 16th European Photovoltaic Solar Energy Conference and Exhibition, May 2002, pp. 1-4.*

(Continued)

*Primary Examiner* — Basia Ridley
*Assistant Examiner* — Devina Pillay
(74) *Attorney, Agent, or Firm* — Mattingly & Malur, PC

(57) ABSTRACT

Photovoltaic structures for the conversion of solar irradiance into electrical free energy. In a particular implementation, a photovoltaic cell includes a granular semiconductor and oxide layer with nanometer-size absorber semiconductor grains surrounded by a matrix of oxide. The semiconductor and oxide layer is disposed between electron and hole conducting layers. In some implementations, multiple semiconductor and oxide layers can be deposited.

5 Claims, 20 Drawing Sheets

U.S. PATENT DOCUMENTS

| | | | |
|---|---|---|---|
| 2004/0187912 | A1 | 9/2004 | Takamoto |
| 2005/0006714 | A1 | 1/2005 | Graetzel et al. |
| 2005/0061364 | A1* | 3/2005 | Peumans et al. ............. 136/263 |
| 2005/0121068 | A1* | 6/2005 | Sager et al. ................... 136/252 |
| 2005/0155641 | A1 | 7/2005 | Fafard .......................... 136/249 |
| 2006/0008580 | A1 | 1/2006 | Nelles et al. .................. 427/162 |
| 2006/0086385 | A1 | 4/2006 | Nakano et al. ................ 136/255 |
| 2006/0207647 | A1* | 9/2006 | Tsakalakos et al. .......... 136/256 |
| 2007/0111368 | A1* | 5/2007 | Zhang et al. .................... 438/99 |
| 2007/0240757 | A1 | 10/2007 | Ren |
| 2010/0043872 | A1 | 2/2010 | Richter |
| 2010/0044675 | A1 | 2/2010 | Richter |
| 2010/0047595 | A1 | 2/2010 | Harkness, IV |
| 2010/0051095 | A1 | 3/2010 | Richter |

OTHER PUBLICATIONS

Lenzmann, F., et. al., "Substantial improvement of the photovoltaic characteristics of $TiO_2$/ CuInS$_2$ interfaces by the use of recombination barrier coatings," @ 2003 Elsevier B.V., www.elsevier.com/locate/tsf.

Grätzel M., "Dye-sensitized solar cells," Journal of Photochemistry and Photobiology, @ 2003 Japanese Photochemistry Assocation, Published by Elsevier B.V., www.elsevier.com/locate/jphotochemrev.

Qi, D., et. al., "Efficient polymer-nanocrystal quantum-dot photodetectors," Applied Physics Letters 86, 093103 (2005), @ 2005 American Institute of Physics, Downloaded Sep. 4, 2007.

Shi, J.Z., et. al., "Influence of dual-Ru intermediate layers on magnetic properties and recording performance of CoCrPt-SiO$_2$ perpendicular recording media," Applied Physics Letters 87, 222503 (2005), @ 2005 American Institute of Physics, Downloaded Sep. 1, 2007.

Schaller, R., et. al., "Effect of electronic structure on carrier multiplication efficiency: Comparative study of PbSe and CdSe nanocrystals," Applied Phyics Letters 87, 253102 (2005), @ 2005 American Institute of Physics, Downloaded Sep. 4, 2007.

Piramanayagam, S.N., et.al., "Advanced perpendicular recording media structure with a magnetic intermediate layer," Applied Physics Letters 88, 092501 (2006), @ 2006 American Institute of Physics, Downloaded Sep. 1, 2007.

Park, S.H., et. al., "Effect of MgO and Al$_2$O$_3$ on the microstructure and magnetic properties of CoCrPt-oxide perpendicular recording media," Journal of Applied Physics 97, 10N106 (2005), @ 2005 American Institute of Physics, Downloaded Sep. 1, 2007.

Shimatsu, T., et. al., "K$_{u2}$ magnetic anistropy term of CoPtCr-SiO$_2$ media for high density recording," Journal of Applied Physics 97, 10N111(2005), @ 2005 American Institute of Physics, Downloaded Sep. 1, 2007.

Mukai, R., et. al., "Signal-to-media-noise ratio improvement of CoCrPt-SiO$_2$ granular perpendicular media by stacked Ru underlayer," Journal of Applied Physics 97, 10N119 (2005), @ 2005 American Institute of Physics, Downloaded Sep. 1, 2007.

Takekuma, I., et. al., "Reduction in intermediate layer thickness of CoCrPt-SiO$_2$ perpendicular recording media by using Ru-SiO$_2$," Journal of Applied Physics 99, 08E713 (2006), @ 2006 American Institute of Physics, Downloaded Sep. 1, 2007.

Lee, H., et. al., "Effects of substrate bias on CoCrPt-SiO$_2$ magnetic recording media," Journal of Applied Physics 99, 08G910 (2006), @ 2006 American Institute of Physics, Downloaded Sep. 1, 2007.

Piramanayagam, S.N. "Perpendicular recording media for hard disk drives." Applied Physics Reviews-Focused Review, Journal of Applied Physics 102, 011301 (2007) @ 2007 American Institute of Physics, Downloaded Sep. 1, 2007.

Ho, M., "Quantum Dots and Ultra-Efficient Solar Cells?" ISIS Press Release Jan. 19, 2006.

Nasa Glenn Research Cneter, "Quantum Dots Investigated for Solar Cells," last updated Jul. 25, 2002.

"Quantum Dots Enables New Advances in Solar Cell Industry," @ 2003-2007 Evident Technologies.

Ernst, K., et. al., "Solar cell with extremely thin absorber on highly structure substrate," Institute of Physics Publishing, Semicond. Sci. Technolo. 18 (2003) 475-479, @ 2003 IOP Publishing Ltd.

"Realization and Development of Extremely Thin Absorber Solid State Solar Cells (ETA)," Riso National Laboratory, Technical University of Denmark, Downloaded Feb. 4, 2008.

Tada, H., et. al., "All-solid-state Z-scheme in CdS-Au-TiO$_2$ three-component nanojunction system," Nature Materials, vol. 5, Oct. 2006, published online Sep. 10, 2006, @ 2006 Nature Publishing Group.

Nozik, A.J., "Exciton Multiplication and Relaxation Dynamics in Quantum Dots: Applications to Ultrahigh-Efficiency Solar Photon Conversion," Inorganic Chemistry, vol. 44. No. 20, 2005, published on Web Sep. 26, 2005, @ 2005 American Chemical Society.

"Dye-sensitized solar cells," Wikipedia, the free encylopedia, Web page last modified Aug. 30, 2007.

*Notification of Transmittal of the International Search Report and the Written Opinion of the International Searching Authority* for International Application No. PCT/US 07/82405; 13 pages, May 8, 2008.

Lee, J. "Comparison of CdS films deposited by different techniques: Effects on CdTe solar cell", Applied Surface Science, 252, 1398-1403 Apr. 2005.

Office Action for U.S. Appl. No. 12/016,172, Sep. 21, 2009.

Office Action for U.S. Appl. No. 11/923,070 dated Mar. 2, 2010.

Office Action for U.S. Appl. No. 12/016,172 dated Apr. 16, 2010.

Yin et al, "Fabrication of highly ordered metallic nanowire array by electrodeposition", *Applied Physics Letters*, 79:7, pp. 1039-1041, Aug. 2001.

Ohlsson et al., "Size, shape, and position controlled GaAs whiskers", *Applied Physics Letters*, 78:20, pp. 3335-3337, Nov. 2001.

Office Action for U.S. Appl. No. 11/923,070 dated Aug. 18, 2011.

Office Action for U.S. Appl. No. 11/923,070 dated Jun. 9, 2011.

Office Action for U.S. Appl. No. 12/016,172 dated Oct. 11, 2011.

\* cited by examiner

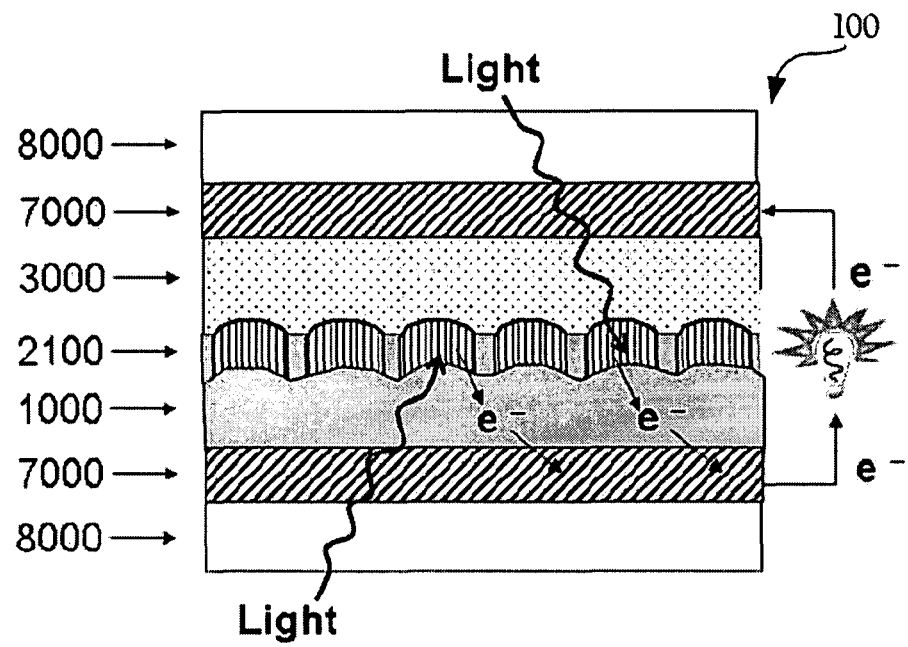
Fig._1a
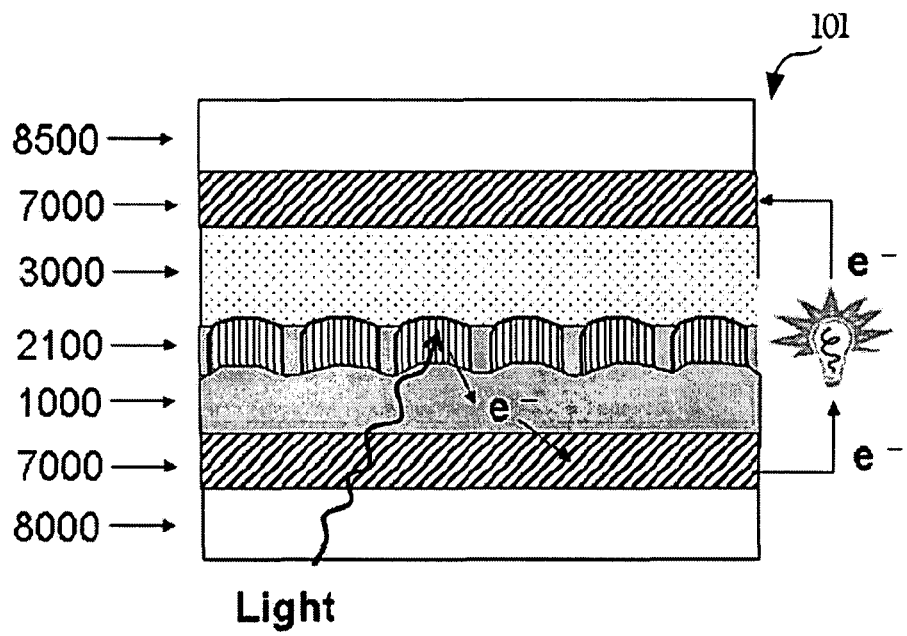
Fig._1b

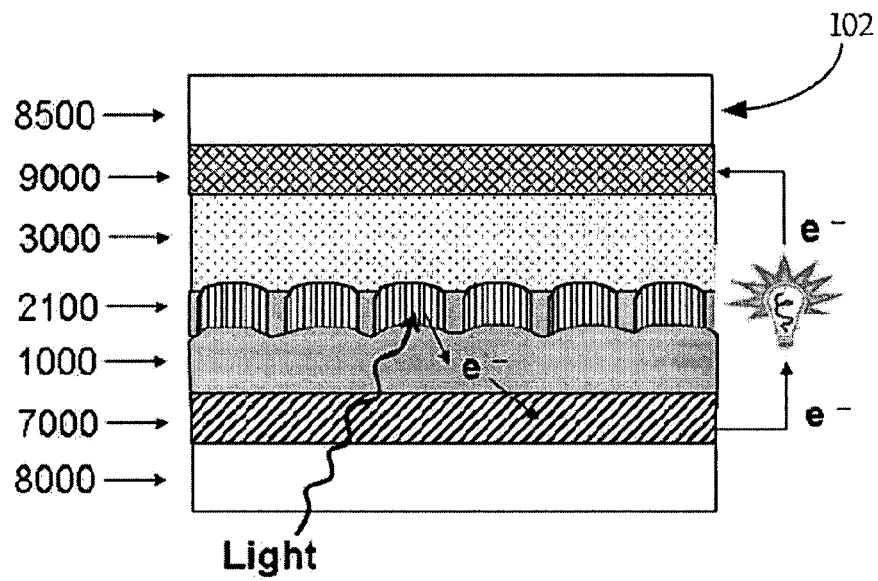
Fig._1c
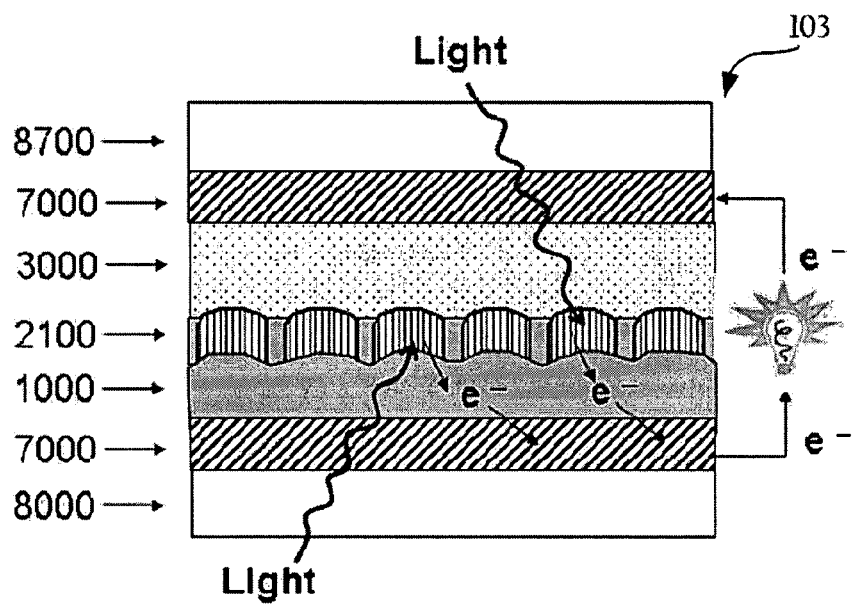
Fig._1d

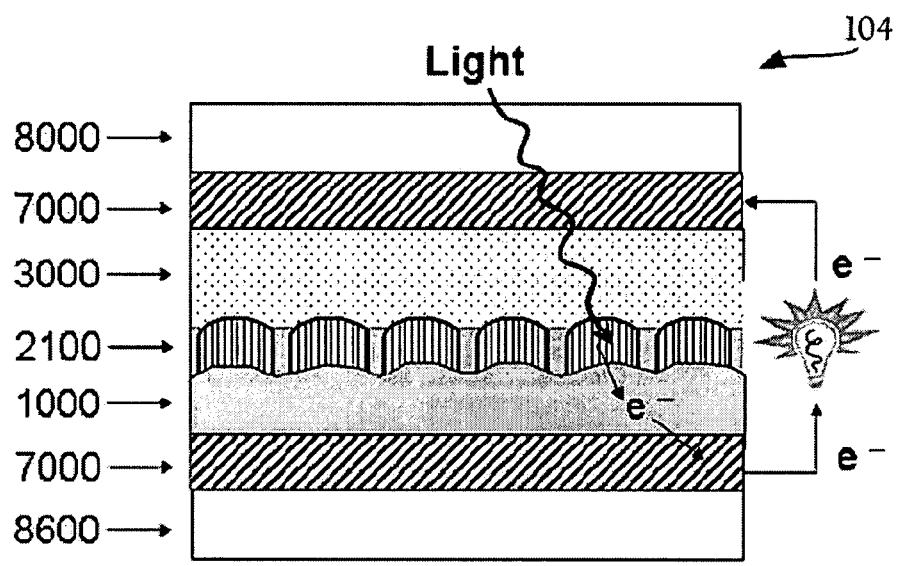
Fig._1e
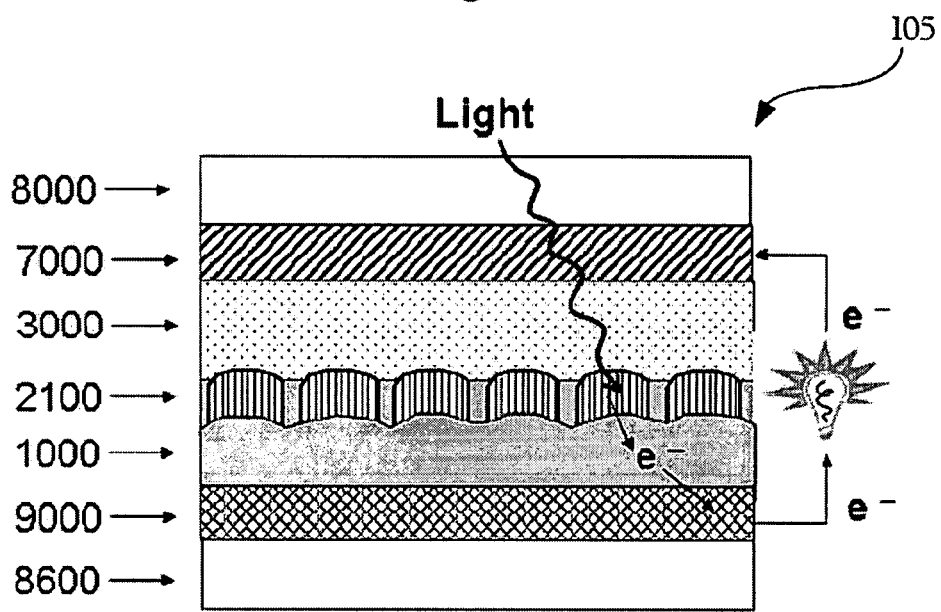
Fig._1f

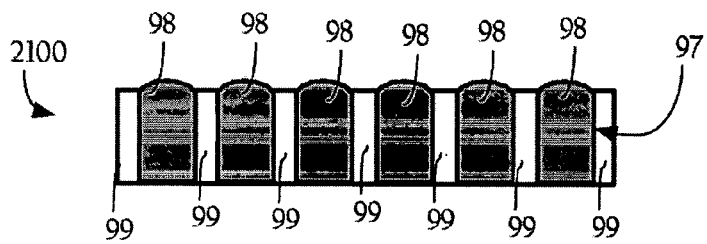
Fig._1g
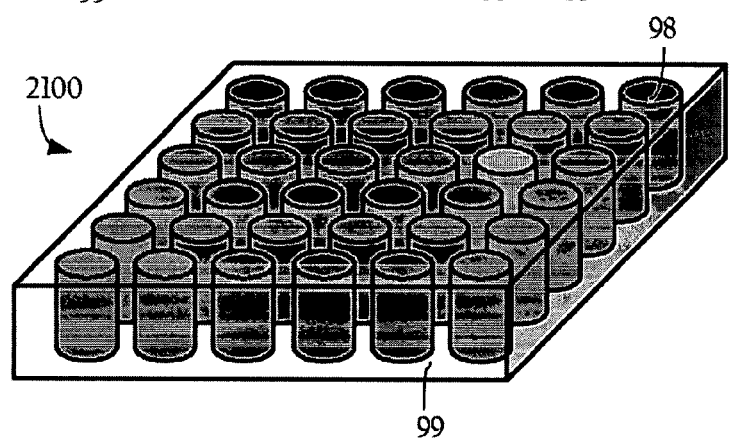
Fig._1h
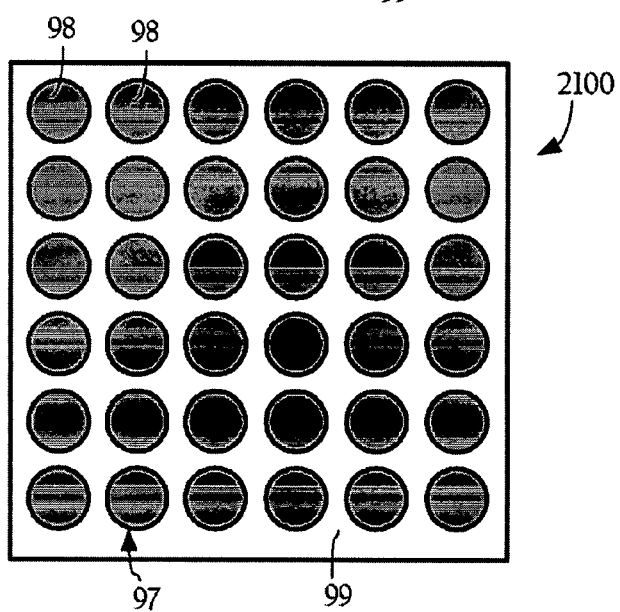
Fig._1i

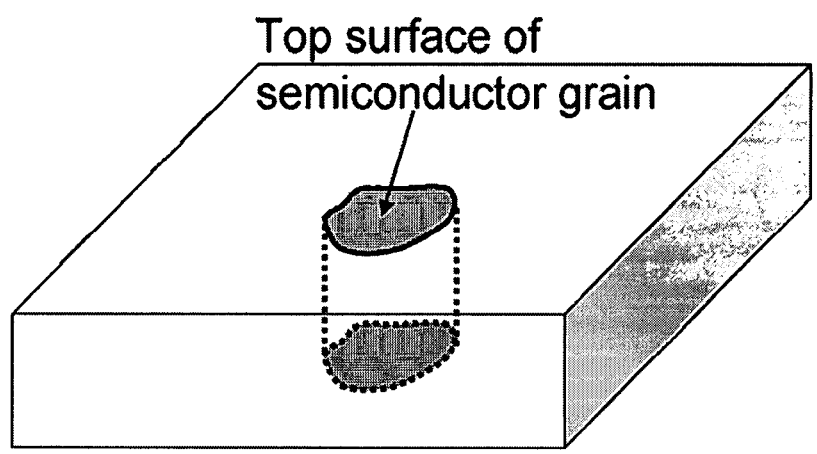
Fig._1j

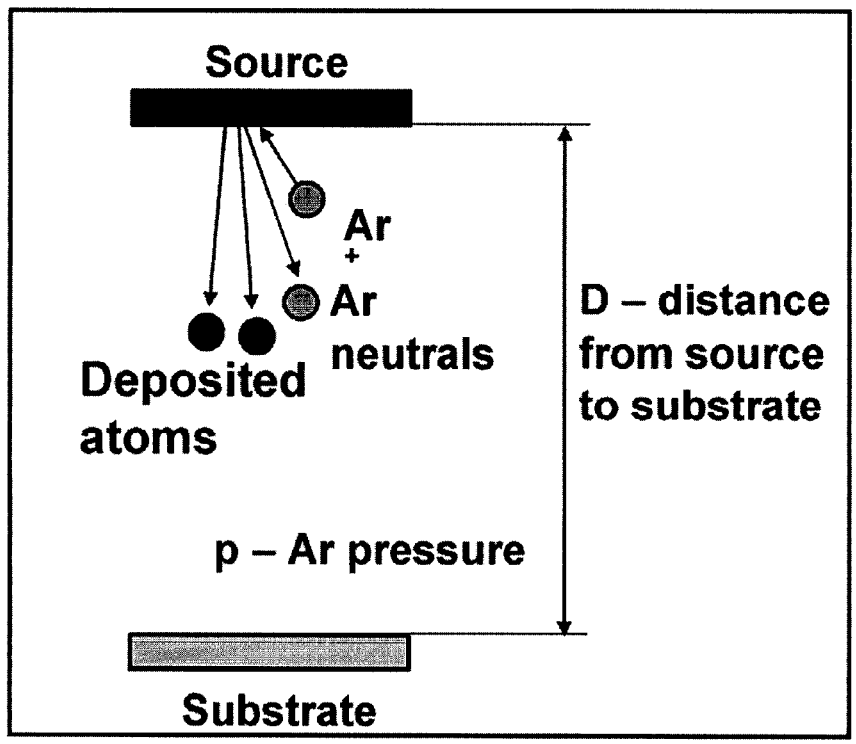
Fig._8
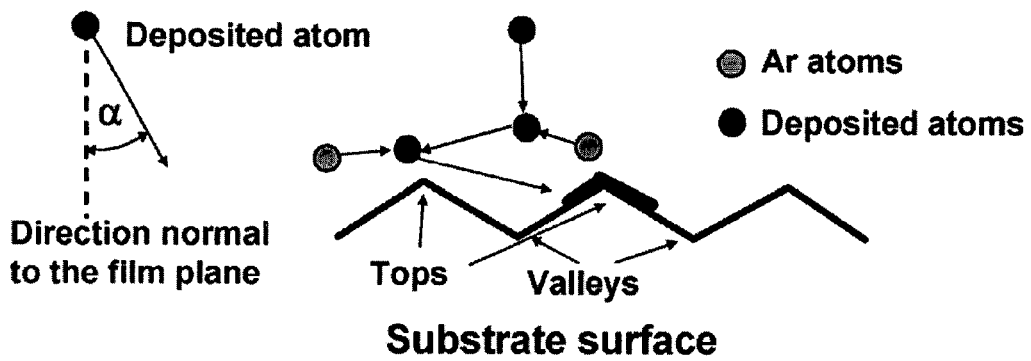
Fig._9

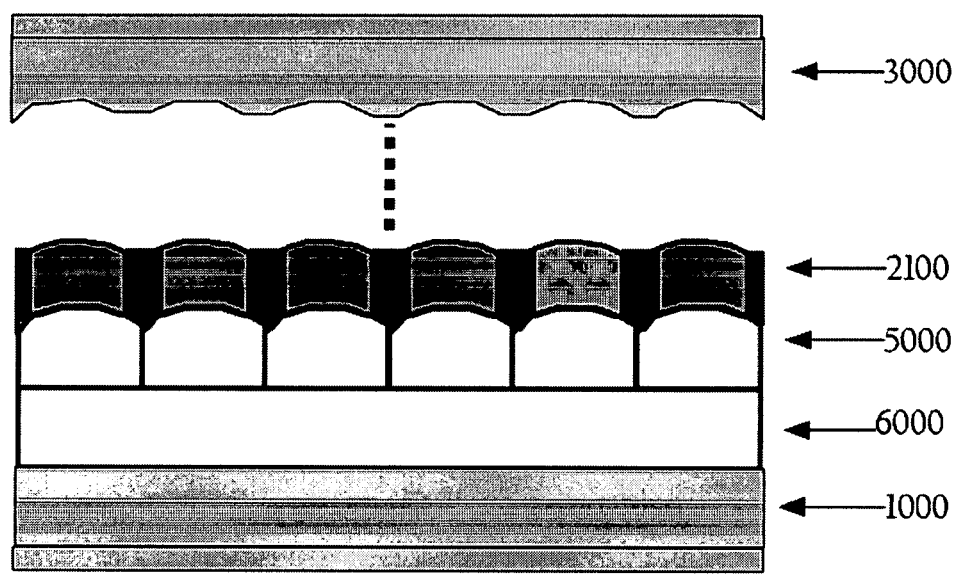
Fig._11

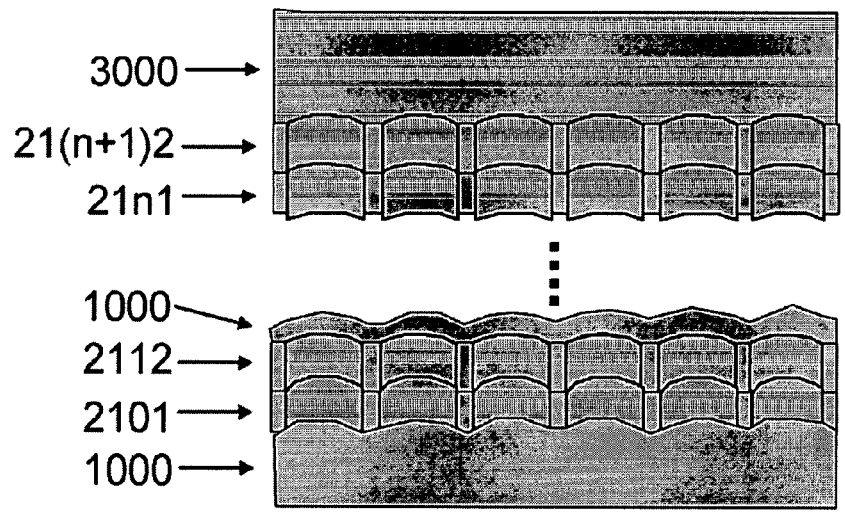
Fig._13a
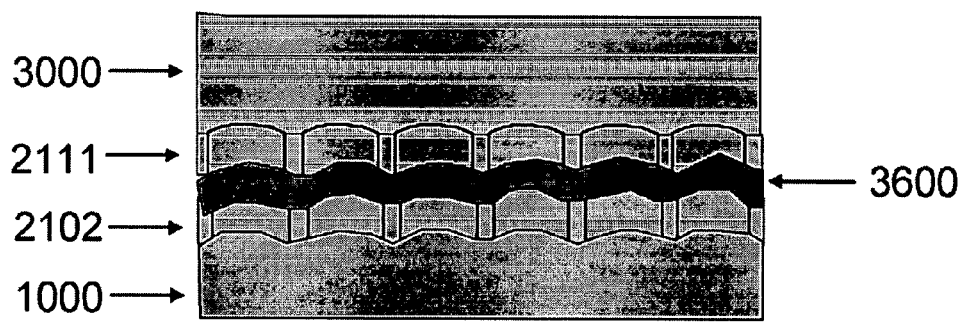
Fig._13b

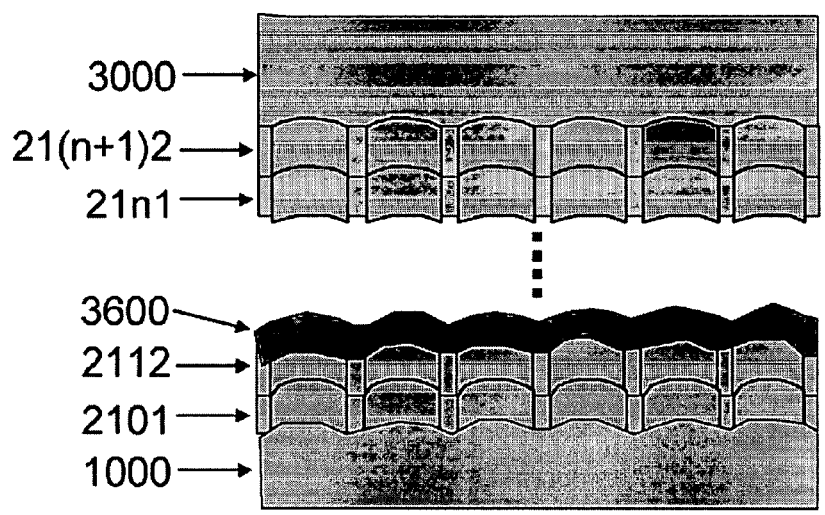
Fig._14a
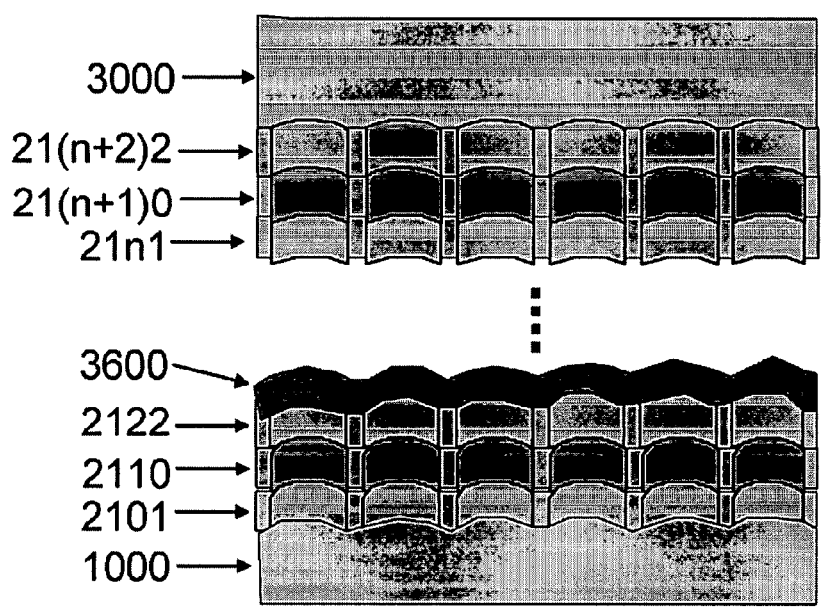
Fig._14b

SEMICONDUCTOR GRAIN AND OXIDE LAYER FOR PHOTOVOLTAIC CELLS

CROSS-REFERENCE TO RELATED APPLICATION(S)

The present application claims priority to the following U.S. Provisional Applications:

1) Provisional Appl. Ser. No. 60/854,226, filed Oct. 24, 2006;
2) Provisional Appl. Ser. No. 60/857,967, filed Nov. 10, 2006; and
3) Provisional Appl. Ser. No. 60/859,593, filed Nov. 17, 2006.

TECHNICAL FIELD

The present disclosure generally relates to photovoltaics.

BACKGROUND

The maximum thermodynamic efficiency for the conversion of non-concentrated solar irradiance into electrical free energy for a single-band semiconductor absorber is approximately 31 percent [W. Shockley, H. J. Queisser, J., Appl. Phys., 32, 510 (1961)]. This efficiency is attainable in semiconductors with band gap energies ranging from 1.25 to 1.45 electronvolts (eV). For semiconductors, band gap generally refers to the energy difference between the top of the valence band and the bottom of the conduction band. The solar spectrum, however, contains photons with energies ranging from about 0.5 to about 3.5 eV. Photons with energies below the semiconductor band gap are not absorbed. On the other hand, photons with energies above the band gap create charge carriers with a total excess kinetic energy, $E_k(excess)=h\nu-E_g$, where $h\nu$ is the photon energy. A significant factor limiting the conversion efficiency to 31% is that the excess kinetic energy (absorbed photon energy above the semiconductor band gap) $E_k(excess)$ is lost as heat through electron-phonon scattering. "Hot" electrons and holes that are created by absorption of solar photons with energies larger than the band gap will relax to their respective band edges.

For a single-band-gap semiconductor absorber there are two ways to extract energy from hot carriers before they relax to the band edge. One method produces an enhanced photovoltage, and the other method produces an enhanced photocurrent. The former method involves extraction of hot carriers from a semiconductor absorber before they relax to their respective band edges. Extracting energy from hot carriers, before they relax to the band edge, is possible if the relaxation rate of hot carriers to their respective band edges is slowed. In the latter method, hot carriers produce two or more electron-hole pairs—so-called impact ionization.

P-n junction solar cells are the most common solar cells, including a layer of n-type semiconductor in direct contact with a layer of p-type semiconductor. If a p-type semiconductor is placed in intimate contact with a n-type semiconductor, then a diffusion of electrons occurs from the region of high electron concentration (the n-type side of the junction) into the region of low electron concentration (p-type side of the junction). The diffusion of carriers does not happen indefinitely, however, because of an opposing electric field created by this charge imbalance. The electric field established across the p-n junction induces separation of charge carriers that are created as result of photon absorption.

Dye-sensitized solar cells and quantum dot-sensitized solar cells are two next generation solar technologies. In dye-sensitized solar cells, dye molecules are chemisorbed onto the surface of 10 to 30 nanometer (nm) size titanium oxide ($TiO_2$) particles that have been sintered into high porous nanocrystalline 10 to 20 μm thick $TiO_2$ films. Upon the photo excitation of dye molecules, electrons are injected from the excited state of dye into the conducting band of the $TiO_2$ creating a charge separation and producing photovoltaic effect. The original state of the dye is subsequently restored by electron donation from the electrolyte, usually an organic solvent containing redox system, such as the iodide/triiodide couple. It is generally accepted that, in dye-sensitized solar cells, the electron transport through the oxide is predominantly governed by diffusion, because the highly conductive electrolyte screens the interior of the cells from any applied electric field.

In quantum dot-sensitized solar cells, semiconductor particles with sizes below 10 nm (so-called quantum dots) take the role of the dye molecules as absorbers. In these solar cells, the hot carriers may produce two or more electron-hole pairs, so-called impact ionization, increasing efficiency of these solar cells. Quantum dot-sensitized solar cells offer several other advantages. The band gaps and thereby the absorption ranges are adjustable through quantum dot size or composition. Furthermore, compared to organic dyes, quantum dot sensitization offers improved stability, since the surface of the semiconductor quantum dot can be modified to improve its photostability.

A noted drawback of both dye-sensitized and quantum dot-sensitized solar cells is long term stability due to the presence of electrolyte. In order to improve stability of quantum dot-sensitized solar cells, the redox electrolyte in these cells can be replaced with a solid hole-conducting material, such as spiro-OMeTAD, or a p-type semiconductor. The former is called a solid state dye-sensitized solar cell, if an absorber is a dye molecule, or a solid state quantum dot-sensitized solar cell, if an absorber is a quantum dot. The latter solar cell, including a p-type semiconductor, is called an extremely thin absorber (ETA) solar cell. In this solar cell, a porous nanocrystalline $TiO_2$ film is covered with a p-type semiconductor absorber using an atomic layer deposition technique, or using electrochemical deposition. These techniques enable a conformal deposition of a semiconductor on top of $TiO_2$. A p-type semiconductor first fills up the pores of porous $TiO_2$ film and then tops the whole structure with a layer about 10 to 200 nm thick. Because of the rough $TiO_2$ surface and a conformal deposition of a p-type semiconductor, the interface area between a p-type semiconductor and an oxide layer increases more than 10 times in comparison to that for a flat $TiO_2$ film covered by a p-type semiconductor layer.

To decrease the relaxation rate of charge carriers, an absorber semiconductor can be inserted between $TiO_2$ (n-type semiconductor) and the solid hole conductor material. In this structure, the n-type semiconductor (oxide, example: $TiO_2$) has a porous structure and the absorber semiconductor is adsorbed at the surface of n-type semiconductor forming individual quantum dots. The average size of the absorber semiconductor quantum dots is below 10 nm to utilize the confinement effect and reduce the relaxation rate of hot carriers increasing efficiency of these solar cells. In the existing fabrication processes of solid state sensitized solar cells porous or rough $TiO_2$ layer is filled (using-electrochemical deposition techniques) with absorber semiconductor grains and covered with p-type semiconductor (using atomic layer deposition or electrochemical deposition techniques) or a different hole conducting inorganic material (using for example spin coating of a solution of hole conductor and chlorobenzene (See J. Kruger, U. Bach, R. Plass, M. Piccerelli, L. Cevey, M. Graetzel, Mat. Res. Soc. Symp. Proc., 708, BB9.1.1 (2002)).

The hole conductor may be an organic transport material. This organic charge transport material may be a polymer, like poly-tiophen or poly-arylamin. The hole conductor may be an organic hole conductor such as spiro- and hetero spiro compounds of the general formula (1)

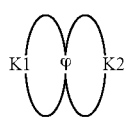

(1)

where $\phi$ is one of C, Si, Ge or Sn, and K1 and K2 are, independently one of the other conjugated systems. One example organic hole conductor is spiro-OMeTAD (2,2',7,7'-tretakis(N,N-di-p-methoxyphenyl-amine)-9-9'-spirobifluorene). The conductivity of pure spiro-OMeTAD is low. Therefore the material cannot be used, without some modification, in solar cells. Rather, partial oxidation of spiro-OMeTAD by $N(PhBr)_3SbCl_6$ can be used to control the dopant level and to increase the conductivity of the hole conducting layer. A second additive $Li[CF_3SO_2]_2N$ can also be added, since Li+ ions have been shown to increase the current output and overall efficiency of the device. The hole conductor matrix can be applied by spin-coating of a solution of the hole conductor in chlorobenzene. MEH-PPV [poly[2-methoxy-[5-(2'-ethyl)hexyl]oxy-p-phenylenevinylene]] and PEDOT:PSS [poly(3,4-ethylenedioxythiophene) poly(styrenesulfonate)] can also be used as hole conductor materials. To increase its conductivity PEDOT:PSS can be mixed with glycerin, N-methylpyrrolidone, and isopropanol.

SUMMARY

The present invention provides methods, apparatuses and systems directed to novel photovoltaic structures for the conversion of solar irradiance into electrical free energy. In particular implementations, the novel photovoltaic structures can be fabricated using low cost and scalable processes, such as magnetron sputtering. In a particular implementation, a photovoltaic cell includes a granular semiconductor and oxide layer with nanometer-size absorber semiconductor grains surrounded by a matrix of oxide. The semiconductor and oxide layer is disposed between electron and hole conducting layers. In some implementations, multiple semiconductor and oxide layers can be deposited. These so-called semiconductor and oxide layers absorb sun light and convert solar irradiance into electrical free energy. Upon illumination with solar irradiance, the nanometer size semiconductor grains inject electrons into the conducting band of oxide, creating charge separation and producing photovoltaic effect. Following charge separation, electrodes extract electrons and holes to produce current. The charge carriers created as a result of photon absorption in the nanometer-size semiconductor grains can be also separated by an electric field formed by the presence of p- and n-type semiconductor layers adjacent to the absorber semiconductor and oxide layer.

The properties of the semiconductor grains can be controlled, and in some instances varied, to achieve a variety of effects and advantages. For example, the size of the semiconductor grains can be configured to facilitate extraction of charge carriers before they can relax to the band edge, increasing the efficiency of the photon conversion in nanometer sized semiconductor absorbers. In addition, the size and/or composition of the semiconductor grains in multiple semiconductor and oxide layers can be varied to match the band gaps of the semiconductor grains to the solar energy spectrum. This can further reduce the energy loss due to the relaxation of carriers to their respective band edges.

DESCRIPTION OF THE DRAWINGS

FIGS. 1a to 1f illustrate example photovoltaic cell structures according to various implementations of the invention.

FIGS. 1g, 1h and 1i illustrate the microstructure configuration of a semiconductor and oxide layer according to an implementation of the invention.

FIG. 1j is a diagram illustrating how semiconductor grain diameter may be determined according to one possible implementation of the invention.

FIG. 8 is a schematic diagram illustrating an example sputter deposition process.

FIG. 9 is a diagram illustrating the deposition of adatoms on a substrate in a high-pressure, low mobility sputter deposition process.

FIG. 11 illustrates a photovoltaic cell configuration according to one possible implementation of the invention.

FIGS. 13a to 13b provide additional example composite layer configurations that that may be used in photovoltaic cells of the present invention.

FIGS. 14a to 14b provide additional example composite layer configurations that that may be used in photovoltaic cells of the present invention.

DESCRIPTION OF PREFERRED EMBODIMENT(S)

A. Overview

Figure 2A:
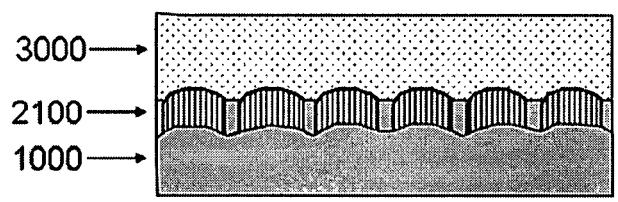
FIGS. 2a to 2d provide example composite photoactive layers that may be used in photovoltaic cells of the present invention.

FIGS. 1a to 1f illustrate example structures and configurations of solar cells according to several possible implementations of the invention. As FIG. 1a illustrates, a solar cell 100 may comprise (in overlying sequence) a glass substrate 8000, a transparent conductive layer 7000, an electron conducting material layer 1000, a semiconductor and oxide layer 2100, a hole conducting material layer 3000. This layer structure is covered with a second transparent conductive layer 7000 and a second glass layer 8000. In a particular implementation, the transparent conductive layer 7000 may be indium oxide doped with tin oxide. Electron conducting material layer 1000 may be an oxide material or n-type semiconductor material. Hole conducting material layer 3000 may be a p-type semiconductor or other hole conducting material (such as spiro-OMeTAD). Semiconductor and oxide layer 2100 may include an oxide dispersed at grain boundaries of an intrinsic semiconductor.

In other implementations, solar cell 101, as FIG. 1b shows, may comprise (in overlying sequence) glass substrate 8000, transparent conductive layer 7000, electron conducting material layer 1000, semiconductor and oxide layer 2100, hole conducting material layer 3000, second transparent conductive layer 7000, and a non-transparent protective layer 8500. FIG. 1c shows solar cell 102 comprising (in overlying sequence) glass substrate 8000, transparent conductive layer 7000, electron conducting material layer 1000, semiconductor and oxide layer 2100, hole conducting material layer 3000, metal contact layer 9000, and non-transparent protective layer 8500. In FIG. 1d, solar cell 103 comprises (in overlying sequence) glass substrate 8000, transparent conductive layer 7000, electron conducting material layer 1000, semiconductor and oxide layer 2100, hole conducting material layer 3000, second transparent conductive layer 7000, and a transparent protective layer 8700. As FIG. 1e provides, solar cell 104 may include, in overlying sequence, non-transparent substrate 8600, a transparent conductive layer 7000, electron conducting material layer 1000, semiconductor and oxide layer 2100, hole conducting material layer 3000, second transparent conductive layer 7000 and glass layer 8000. In FIG. 1f, solar cell 105 comprises (in overlying sequence) non-transparent substrate 8600, metal contact layer 9000, electron conducting material layer 1000, semiconductor and oxide layer 2100, hole conducting material layer 3000, transparent conductive layer 7000 and glass layer 8000.

Electron conducting material layer 1000, semiconductor and oxide layer 2100, and hole conducting material layer 3000 are, relative to the solar cells shown in FIGS. 1a to 1f, a composite photoactive conversion layer that can be configured to produce a photovoltaic effect in response to solar energy. Semiconductor and oxide layer 2100, in some implementations, is a sensitizing or absorber layer disposed between hole conducting material layer 3000 and an electron conducting material layer 1000. In some implementations, upon photo excitation, electrons are efficiently injected from the conducting band of the semiconductor grains of semiconductor and oxide layer 2100 into the conducting band of electron conducting material layer 1000, creating a charge separation and producing photovoltaic effect. Regeneration of the absorber semiconductor grains can occur by capture of electrons from the hole conducting material layer 3000.

The material composition, layer configuration and layer arrangement of the photovoltaic cells can be configured to achieve a variety of objectives. For example, depending on material choice, the nanometer-sized grains of the intrinsic semiconductor and oxide layer 2100 can operate as absorbers in a p-n heterojunction between an oxide material (such as $TiO_2$) and a hole conducting material (such as OMeTAD). To achieve efficient electron injection into the electron conducting layer, the bottom edge of the conductive band of the absorber, $E_c$(absorber), should be higher than the bottom edge of the conductive band of the electron conducting layer, $E_c$(electron conducting layer). On the other hand, the top edge of the valence band of the absorber, $E_v$(absorber), should be lower than the top edge of the valence band of the hole conducting layer, $E_v$, or the Fermi level of organic hole conductor material, to promote efficient regeneration of the absorber semiconductor grains. In other implementations, the layers of the cell structure can be configured to create p-n junctions with an electric field across the depletion region between a p-type semiconductor layer and an n-type semiconductor layer. One or more intrinsic semiconductor layers can be disposed between these p-type and n-type semiconductor layers, as well.

Figure 2B:
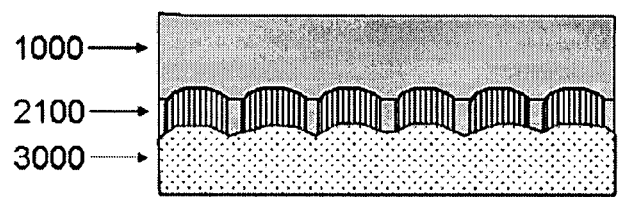

As FIGS. 2a to 2d provide, the structure and composition of this composite photoactive conversion layer can be varied to achieve a vast array of different photovoltaic cell structures and configurations. FIG. 2a illustrates a composite photoactive conversion layer comprising, deposited in overlying sequence, an electron conducting material layer 1000 (such as an oxide material or n-type semiconductor layer), semiconductor and oxide layer 2100, and hole conducting material layer 3000 (such as a p-type semiconductor layer). As FIG. 2b illustrates, the composite photoactive conversion layer may be deposited in a reverse relation comprising, in overlying deposited sequence, hole conducting material layer 3000, semiconductor and oxide layer 2100, and electron conducting material layer 1000.

Figure 2C:
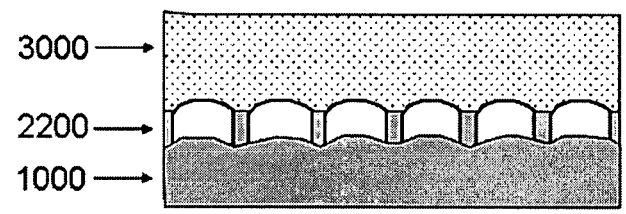
Figure 2D:
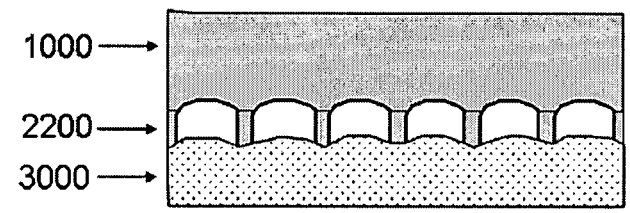

Other implementations are possible. For example, a metal and oxide layer 2200 may replace the semiconductor and oxide layer 2100 as a sensitizing layer. For example, as FIG. 2c shows, the composite photoactive conversion layer may comprise, in overlying sequence, electron conducting material layer 1000, metal and oxide layer 2200 and hole conducting material layer 3000. Alternatively, as FIG. 2d illustrates, the composite photoactive conversion layer may comprise, in overlying sequence, hole conducting material layer 3000, metal and oxide layer 2200, and electron conducting material layer 1000. As discussed below, the metal and oxide layer 2200 may also be used in combination with the semiconductor and oxide layer 2100.

Glass layer 8000 can be a glass substrate or deposited layer made of a variety of materials, such as silicon dioxide. Alternatively, a polymer can be used. Still further, one or more of the transparent conducting layers 7000 can be replaced by metal contacts arranged in a grid (e.g., fingers and busbars) on one side (or both sides) and a full area metal contact on the other side. Additional layers, such as anti-reflection coatings can also be added. The layer stack can be deposited on glass, polymer or metal substrates. If the layer stack is deposited on top of a non-transparent substrate, the top contact is transparent to allow light penetration into the photoactive conversion layer. Glass layer 8000 can be replaced by other suitable protective layers or coatings, or be added during construction of a solar module or panel. Still further, the layers described herein may be deposited on a flat substrate (such as a glass substrate intended for window installations), or directly on one or more surfaces of a non-imaging solar concentrator, such as a trough-like or Winston optical concentrator.

A.1. Semiconductor and Oxide Layer

Structurally, semiconductor and oxide layer 2100 is a granular layer comprising a plurality of nanometer-sized cylinder-like semiconductor grains 98 contained in, or surrounded by, a matrix of oxide material 99. In other words, the oxide material is dispersed at grain boundaries 97 of the semiconductor. Formation of the semiconductor and oxide layer 2100 is discussed below. In the semiconductor and oxide layer(s), upon photoexcitation of semiconductor grains 98, electrons are injected into the surrounding oxide matrix 99 or generated charge carriers (electrons and holes) are separated by an electric field created by p-type and n-type semiconductor materials in the adjacent layers.

FIGS. 1g to 1i illustrate an example microstructure of the semiconductor and oxide layer 2100 according to one possible implementation of the invention. One skilled in the art will recognize that these Figures are idealized representations of the microstructure of the semiconductor grains 98 and that the boundaries between the semiconductor grains and the oxide matrix may, and often will, not be defined by perfect cylinders. For example, in the semiconductor and oxide layers, the semiconductor grains will generally not have a perfect cylindrical shape. In addition, in some instances, neighboring semiconductor grains may be in direct contact as opposed to being completely separated by oxide material. The size of cylinder-like semiconductor grains in the semiconductor and oxide layer is defined by the diameter and the height of these grains. The diameters of the semiconductor grains at a given layer may vary from a minimum to a maximum grain diameter. The average semiconductor grain diameter can be defined as the mean or average value of all semiconductor grain diameters in the semiconductor and oxide layer 2100. FIG. 1j shows an example of a semiconductor grain 98 surrounded by an oxide material. Since grains generally do not have a perfect cylindrical shape, the diameter of the grain can be defined as $2*(S/\pi)^{0.5}$ where S is the area of the top surface of the grain, i.e., S is the surface area that the semiconductor grain shares with the layer deposited on top of the semiconductor and oxide layer 2100. The average diameter of the semiconductor grains in the semiconductor and oxide layer can vary considerably up to about 100 nm. However, a preferred average diameter of the semiconductor grains in the semiconductor and oxide layer can be up to 10, 15, 20 or 40 nm. Some semiconductor and oxide layers may have smaller average diameters as well. The height of the semiconductor grain is substantially equal to the thickness of the semiconductor and oxide layer 2100. The thickness of the layers can vary considerably up to about 4000 nm. However, a preferred thickness of the semiconductor and oxide layer can be up to 400 nm. In some implementations, multiple semiconductor and oxide sub-layers (each with varying the average semiconductor grain diameters ranging from 3 to 12 nm and thicknesses ranging from 3 to 25 nm) can be deposited. In one example configuration, five semiconductor and oxide sub-layers with the average semiconductor grain diameter, in descending order, of 12/10/7/5/3 nanometers and thicknesses, in descending order, of 25/10/7/5/3 nanometers can be deposited. Still further, the oxide content of the semiconductor and oxide layers can range from 1 to 99 percent of a given layer by volume. However, a preferred oxide content of the semiconductor and oxide layers can range from 5 to 75 percent of a given layer by volume.

As discussed, multiple semiconductor and oxide layers may be deposited. Furthermore, the semiconductor material in semiconductor and oxide layers may be an intrinsic semiconductor material, a p-type semiconductor material, or an n-type semiconductor material. Various implementations discussed below utilize one or more of these semiconductor and oxide layers in varying configurations, combinations and arrangements to yield high efficiency solar cells. For purposes of description, this disclosure refers to an intrinsic semiconductor and oxide layers using a reference number convention of 21x0, where x equals a layer number from 1 to N (where N equals the number of layers). Similarly, this disclosure refers to n-type semiconductor and oxide layers using a reference number convention of 21x1, where x equals a layer number from 1 to N. Lastly, this disclosure refers to p-type semiconductor and oxide layers using a reference number convention of 21x2, where x equals a layer number from 1 to N.

In the photovoltaic cells illustrated in FIGS. 1a to 1c, for example, intrinsic semiconductor grains operate as absorbers. In other words, light excites electrons in the absorber semiconductor grains 98, which are injected into the conduction band of the oxide matrix 99 or into the conduction band of an electron conductor. The absorber semiconductor grains 98 are regenerated by capture of electrons from the valence band of a hole conducting material layer 3000 (such as a p-type semiconductor). For intrinsic semiconductor and oxide layer 2100, the semiconductor material may be an intrinsic semiconductor comprising one or more of silicon (Si), germanium (Ge), tin (Sn), beta iron silicide ($\beta$-FeSi$_2$), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies form 0 to 1)), copper indium diselenide (CuInSe$_2$), copper gallium diselenide (CuGaSe$_2$), copper indium gallium diselenide ($Cu(In_{1-x}Ga_x)Se_2$ (x varies form 0 to 1)), copper silver indium gallium disulfide ($Cu_{1-x}Ag_x)(In_{1-y}Ga_y)S_2$ (x varies form 0 to 1, y varies form 0 to 1)), copper silver indium gallium diselenide ($Cu_{1-x}Ag_x)(In_{1-y}Ga_y)Se_2$ (x varies form 0 to 1, y varies form 0 to 1)), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), and copper tin sulfide (Cu$_4$SnS$_4$).

The oxide material, for intrinsic semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

For n-type semiconductor and oxide layers 2101, 2111, and 2121, for example, the semiconductor material may be an n-type semiconductor comprising one or more of silicon (Si), germanium (Ge), tin (Sn), beta iron silicide ($\beta$-FeSi$_2$), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide (CuInS$_2$), copper gallium disulfide (CuGaS$_2$), copper indium gallium disulfide, ($Cu(In_{1-x}Ga_x)S_2$ (x varies form 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies form 0 to 1)), copper silver indium gallium disulfide-(Cu$_{1-x}$Ag$_x$)(In$_{1-y}$Ga$_y$)S$_2$ (x varies form 0 to 1, y varies form 0 to 1)), copper silver indium gallium diselenide (Cu$_{1-x}$Ag$_x$)(In$_{1-y}$Ga$_y$)Se$_2$ (x varies form 0 to 1, y varies form 0 to 1)), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), copper tin sulfide (Cu$_4$SnS$_4$). Such semiconductors may be doped by adding an impurity of valence-five elements such as nitrogen (N), phosphorus (P), arsenic (As), or antimony (Sb)), in order to increase the number of free (in this case negative (electron)) charge carriers.

The oxide material, for n-type semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

For p-type semiconductor and oxide layers 2102, 2112, and 2122, for example, the semiconductor material may be a p-type semiconductor comprising one or more of silicon (Si), germanium (Ge), tin (Sn), beta iron silicide (—FeSi$_2$), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu$_{1-x}$S (x varies from 1 to 2)), copper selenide (Cu$_{1-x}$Se (x varies from 1 to 2)), copper indium disulfide (CuInS$_2$), copper gallium disulfide (CuGaS$_2$), copper indium gallium disulfide, (Cu(In$_{1-x}$Ga$_x$)S$_2$ (x varies form 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies form 0 to 1)), copper silver indium gallium disulfide (Cu$_{1-x}$Ag$_x$)(In$_{1-y}$Ga$_y$)S$_2$ (x varies form 0 to 1, y varies form 0 to 1)), copper silver indium gallium diselenide (Cu$_{1-x}$Ag$_x$)(In$_{1-y}$Ga$_y$)Se$_2$ (x varies form 0 to 1, y varies form 0 to 1)), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide (SnSe$_x$ (x varies from 1 to 2)), copper tin sulfide (Cu$_4$SnS$_4$). Such semiconductors may be doped by adding an impurity of valence-three elements such as boron (B), gallium (Ga), indium (In), or aluminum (Al), in order to increase the number of free (in this case positive (hole)) charge carriers.

The oxide material, for p-type semiconductor and oxide layers, may include one or more of magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

Metal and oxide layer 2200 includes a metal and an oxide. In a particular implementation, the metal may be at least one metal material selected from group consisting of Al, Ti, V, Cr, Mn, Fe, Co, Ni, Cu, Zr, Nb, Mo, Ru, Rh, Pd, Pt, Ag, Hf, Ta, W, Re, Ir, Au. The oxide material may be at least one oxide material selected from group consisting of: magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide.

A.2. Electron Conducting Material Layer

Electron conducting material layer 1000 may be an oxide material, an n-type semiconductor material, or an organic electron conducting material. Inorganic electron conducting materials, such as oxides and n-type semiconductors, may have a crystalline structure. The melting temperature of an inorganic electron conducting material (oxide or n-type semiconductor) and glass temperature of organic electron conducting material should be above 80 C.

Electron conducting material layer 1000 may be an oxide material including one or more of titanium (Ti) oxide (such as TiO$_2$), aluminum (Al) oxide, cobalt (Co) oxide, silicon (Si) oxide, tin (Sn) oxide, zinc (Zn) oxide, molybdenum (Mo) oxide, tantalum (Ta) oxide, tungsten (W) oxide, indium (In) oxide, magnesium (Mg) oxide, bismuth (Bi) oxide, copper (Cu) oxide, vanadium (V) oxide, chromium (Cr) oxide. Electron conducting material layer 1000 may be an n-type semiconductor material including one or more of silicon (Si), germanium (Ge), tin (Sn), beta iron silicide (β-FeSi$_2$), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide (Cu$_{1-x}$S (x varies from 1 to 2)), copper selenide (Cu$_{1-x}$Se (x varies from 1 to 2)), copper indium disulfide (CuInS$_2$), copper gallium disulfide (CuGaS$_2$), copper indium gallium disulfide, (Cu(In$_{1-x}$Ga$_x$)S$_2$ (x varies form 0 to 1)), copper indium diselenide (CuInSe$_2$), copper gallium diselenide (CuGaSe$_2$), copper indium gallium diselenide (Cu(In$_{1-x}$Ga$_x$)Se$_2$ (x varies form 0 to 1)), copper silver indium gallium disulfide (Cu$_{1-x}$Ag$_x$)(In$_{1-y}$Ga$_y$)S$_2$ (x varies form 0 to 1, y varies form 0 to 1)), copper silver indium gallium diselenide (Cu$_{1-x}$Ag$_x$)(In$_{1-y}$Ga$_y$)Se$_2$ (x varies form 0 to 1, y varies form 0 to 1)), indium sulfide (In$_2$S$_3$), indium selenide (In$_2$Se$_3$), aluminum nitride (AlN), indium nitride (InN), gallium nitride (GaN), bismuth sulfide (Bi$_2$S$_3$), antimony sulfide (Sb$_2$S$_3$), silver sulfide (Ag$_2$S), tungsten sulfide (WS$_2$), tungsten selenide (WSe$_2$), molybdenum sulfide (MoS$_2$), molybdenum selenide (MoSe$_2$), tin sulfide (SnS$_x$ (x varies from 1 to 2)), tin selenide ($SnSe_x$ (x varies from 1 to 2)), copper tin sulfide ($Cu_4SnS_4$). Such semiconductors may be doped by adding an impurity of valence-five elements such as nitrogen (N), phosphorus (P), arsenic (As), or antimony (Sb)), in order to increase the number of free (in this case negative (electron)) charge carriers.

Alternatively, electron conducting material layer 1000 may be an organic electron conducting material such as perylene benzimidazole (PBI), perylene bis(piridylethylimide) (PPyEI), perylene-bis(phenethylimide) (PPEI) and [6,6]-phenyl-$C_{71}$-butyric acid methyl ester (PCBM).

A.3. Hole Conducting Material Layer

Hole conducting material layer 3000 may be a p-type semiconductor or other inorganic or organic hole conducting material. In a particular implementation, the melting temperature of an inorganic hole conducting material and the glass temperature of organic hole conducting material should be above 80 C.

In one implementation, hole conducting material layer 3000 may comprise a semiconductor material that may be doped by adding an impurity of valence-three elements such as boron (B), gallium (Ga), indium (In) or aluminum (Al), in order to increase the number of free (in this case positive (hole)) charge carriers, including at least one of the following materials: silicon (Si), germanium (Ge), tin (Sn), beta iron silicide (β-$FeSi_2$), indium antimony (InSb), indium arsenic (InAs), indium phosphate (InP), gallium phosphate (GaP), gallium arsenic (GaAs), gallium antimony (GaSb), aluminum antimony (AlSb), silicon carbide (SiC), tellurium (Te), zinc antimony (ZnSb), mercury telluride (HgTe), led sulfide (PbS), led selenide (PbSe), led telluride (PbTe), cadmium sulfide (CdS), cadmium selenium (CdSe), cadmium tellurium (CdTe), zinc sulfide (ZnS), zinc selenide (ZnSe), zinc telluride (ZnTe), tin telluride (SnTe), copper sulfide ($Cu_{1-x}S$ (x varies from 1 to 2)), copper selenide ($Cu_{1-x}Se$ (x varies from 1 to 2)), copper indium disulfide ($CuInS_2$), copper gallium disulfide ($CuGaS_2$), copper indium gallium disulfide, ($Cu(In_{1-x}Ga_x)S_2$ (x varies form 0 to 1)), copper indium diselenide ($CuInSe_2$), copper gallium diselenide ($CuGaSe_2$), copper indium gallium diselenide ($Cu(In_{1-x}Ga_x)Se_2$ (x varies form 0 to 1)), copper silver indium gallium disulfide ($Cu_{1-x}Ag_x)(In_{1-y}Ga_y)S_2$ (x varies form 0 to 1, y varies form 0 to 1)) copper silver indium gallium diselenide ($Cu^{1-x}Ag_x)(In_{1-y}Ga_y)Se_2$ (x varies form 0 to 1, y varies form 0 to 1)), indium sulfide ($In_2S_3$), indium selenide ($In_2Se_3$), aluminum nitride (AlN), indium nitride (InN), gallium nitride (GaN), bismuth sulfide ($Bi_2S_3$), antimony sulfide ($Sb_2S_3$), silver sulfide ($Ag_2S$), tungsten sulfide ($WS_2$), tungsten selenide ($WSe_2$), molybdenum sulfide ($MoS_2$), molybdenum selenide ($MoSe_2$), tin sulfide ($SnS_x$ (x varies from 1 to 2)), tin selenide ($SnSe_x$ (x varies from 1 to 2)), copper tin sulfide ($Cu_4SnS_4$). Such semiconductors may be doped by adding an impurity of valence-three elements such as boron (B) or aluminum (Al), in order to increase the number of free (in this case positive (hole)) charge carriers. Other suitable p-type semiconductor materials include copper thiocyanate (CuSCN), cuprous iodide (CuI), copper aluminum oxide ($CuAlO_2$) and organic hole-conductors, such as spiro-OMeTAD (2,2',7,7'-tretakis (N,N-di-p-methoxyphenyl-amine)-9-9'-spirofifluorene) (partial oxidation of spiro-OMeTAD by $N(PhBr)_3SbCl_6$ can be used to control the dopant level), MEH-PPV [poly[2-methoxy-[5-(2'-ethyl)hexyl]oxy-p-phenylenevinylene]] and PEDOT:PSS [poly(3,4-ethylenedioxythiophene)poly(styrenesulfonate)] (to increase its conductivity PEDOT:PSS can be mixed with glycerin, N-methylpyrrolidone, and isopropanol).

B. Fabrication of Photovoltaic Cell Layers

The semiconductor and oxide layers can be fabricated using a sputter deposition process (such as magnetron sputtering) in order to produce a layer structure that comprises semiconductor grains surrounded by an oxide matrix. Sputtering conditions and other process settings result in dispersal of oxide at grain boundaries of the semiconductor, as well as control the size of semiconductor grains and the ratio between the volume fraction of semiconductor and oxide materials. In a particular implementation, a semiconductor and oxide layer including semiconductor grains isolated in a matrix of oxide can be prepared by sputtering a metal interlayer (such as an Ru interlayer) and then cosputtering a semiconductor with an oxide material with low adatom mobility. The oxide material moves into the semiconductor grain boundaries and isolates the semiconductor grains. To reduce decomposition of oxide during the sputtering, an oxide material with large diatomic bond strength between metal and oxygen can be used.

As discussed above, the semiconductor grains 98 have a generally cylindrical or columnar shape where the dimension of the cylinder depends on the semiconductor grain diameter and the thickness of the semiconductor and oxide layer. The ratio between the volume fraction of oxide and semiconductor material can be controlled by varying the composition of sputtering target (source). Additionally, the diameter of absorber semiconductor grains can be controlled by sputtering an interlayer prior to sputtering the semiconductor and oxide layer. Semiconductor grains in the semiconductor and oxide layer grow on top of the interlayer grains while oxide is dispersed around the semiconductor grains. Thus, in most instances, the diameter of interlayer grains can control or strongly influence the diameter of semiconductor grains in the semiconductor and oxide layer deposited on the interlayer. Sometimes, if the interlayer grains are large (over 15 nm), it is also possible that two or more semiconductor grains grow on a single interlayer grain. The interface area between semiconductor grains 98 and oxide (both the oxide matrix and oxide in an adjacent layer) depends on the semiconductor grain diameter and the thickness of the semiconductor and oxide layer. However, the interface area can be over 100 times larger than that for a flat junction between an oxide layer and a semiconductor layer or films. As illustrated above, the semiconductor and oxide layer can be located between an oxide material (or other n-type semiconductor) and a p-type semiconductor (or other hole conducting material) that can also be sputtered with magnetron sputtering. This layer structure is used in solar cells where the semiconductor grains absorb the solar radiation. This process also allows fabrication of multilayer structures with semiconductor grains surrounded with oxide materials, where an oxide material preferentially grows on top of an oxide material and a semiconductor material preferentially grows on top of a semiconductor material. In multilayer structures the composition of oxide and semiconductor in each layer can be varied separately to increase the efficiency of photon conversion.

In an example sputtering process, argon (Ar) ions strike a source generating atoms that are deposited on a substrate as shown in FIG. 8. Positive argon ions may be accelerated toward the source by applying negative potential on the source. The distance from the target to the substrate is D and Ar pressure in the sputter chamber is p. Mobility of atoms deposited on the substrate is affected by the kinetic energy of the deposited atoms as well as the kinetic energy of Ar neutrals that strike the substrate surface. Ar ions that strike the target source receive an electron and bounce off the source as Ar neutrals. If these Ar neutrals strike the substrate surface they increase the mobility of the deposited atoms. High pressure in the sputtering chamber, p, will also increase the probability of collision between Ar neutrals and the rest of the Ar atoms in the chamber reducing $E_k$ of the Ar neutrals and reducing the effect of Ar neutrals on mobility of deposited atoms. In addition, a low negative voltage bias may be applied to the substrate to influence or further control surface mobility.

Similarly, the kinetic energy, $E_k$, and angle, $\alpha$, (see FIG. 9) at which deposited atoms land on a substrate surface depend on Ar pressure in the sputtering chamber. If the pressure is high, the probability of collisions between deposited atoms and Ar atoms is larger resulting in a reduction of $E_k$ (atoms) and an increase of $\alpha$ of the deposited atoms (see FIG. 9). In other words, these collisions alter the direction or angle at which atoms are deposited on the substrate surface. As FIG. 9 illustrates, $\alpha$ is an angle between the direction that is normal to the film plane and the direction of deposited atom. Without collisions with Ar atoms, the majority of atoms will be deposited at low $\alpha$ angles (i.e., closer to perpendicular to the substrate surface). Collisions increase the average deposition angle $\alpha$ resulting in reduced deposition rate in the valleys in comparison to the tops of the substrate surface.

As an example, a ruthenium (Ru) interlayer can be sputtered at high pressure 6 Pa (45 mTorr) of Ar on a seed layer. Sputtering at higher pressure reduces the mean free path of sputtered Ru atoms (and Ar neutrals reflected from a Ru target) due to collisions with Ar atoms on their path from target to substrate. The collisions reduce the kinetic energy of deposited Ru atoms reducing surface diffusion of Ru atoms, and randomize the angle at which Ru atoms are deposited onto the substrate away from the direction that is normal to film surface. This causes roughness to increase with increasing film thickness because the "tops" of neighboring column structures block the adatoms incident line-of-sight path to the "valleys". Thus, the sputtering rate in the "valleys" is lower than that on the "tops" of the rough area due to the shadowing effect. Continued growth under controlled sputtering conditions (such as low temperature and high pressure) therefore results in increasingly voided (physically separated) columnar structures.

Applying a similar sputtering process to a composite target of (or otherwise co-sputtering) a semiconductor and an oxide results in a similar structure. That is, the semiconductor atoms deposited on the substrate surface form columnar structures during the sputtering process, while the oxide material is dispersed by the semiconductor grain boundaries forming a matrix that surrounds or isolates the semiconductor grains.

While the semiconductor and oxide layer can be formed directly on an oxide or other layer, it can also be grown or sputter deposited on an interlayer, such as an Ru interlayer (as formed above), which induces or promotes vertical columnar growth in the semiconductor and oxide layer. That is, the interlayer can control the crystallographic growth orientation, grain diameter of semiconductor and most importantly surface roughness required for segregating oxide in grain boundaries. For example, cosputtering of semiconductor and oxide, under high pressure, causes semiconductor grains to grow on top of the Ru grains with oxide segregating to semiconductor grain boundaries. In addition, a metal material may be added to the semiconductor and oxide layer to promote growth of the desired composition and microstructure of the semiconductor and oxide layer. The metal material may be at least one of the following materials: Al, Ti, V, Cr, Mn, Fe, Co, Ni, Cu, Zr, Nb, Mo, Ru, Rh, Pd, Pt, Ag, Hf, Ta, W, Re, Ir, and Au. The metal material may be embodied in a separate target and co-sputtered with semiconductor and oxide target(s) or be mixed into the same target.

Still further, after deposition of one or more semiconductor and oxide layers, the structure may be annealed in the presence of inert or reactive gasses to obtain desired composition, compound and crystal structures and/or to reduce defects. Annealing temperatures may vary up to 1000 degrees C.; however, annealing temperatures in the range of 150 to 600 degrees C. are preferred. After a given annealing step, the structure is preferably cooled if the next layer to be sputtered is also semiconductor and oxide layer.

In a particular implementation, the semiconductor and oxide layer can be formed using a magnetron sputtering in the presence of a gas, under one or more of the following sputtering conditions: 1) a total atmospheric pressure during sputtering of at least 0.8 Pa (6 mTorr); 2) an applied bias on a substrate during the sputtering of less than 400 V, and 3) a temperature of a substrate during the sputtering below 200 degrees C. Total atmospheric pressure in the chamber, $p_{tot}$, required to achieve the segregation of oxide to grain boundaries in the semiconductor and oxide layer depends on the distance from source to the substrate, D, and the deposition rate, DR, (the number of atoms that land on a substrate per second and can be also defined as a thickness of the deposited layer per second). As D increases, oxide segregation at semiconductor grain boundaries can be achieved with lower $p_{tot}$ pressure. If D increases the probability of collisions between deposited atoms and Ar atoms increases. On the other hand, as DR increases, $p_{tot}$ pressure has to be higher to lower the surface mobility of deposited atoms required for the oxide segregation. For example, if D=2 cm, and DR is larger than 1 nm/s, $p_{tot}$ pressure should be larger than 1.3 Pa (10 mTorr). If D=2 cm, and DR is larger than 5 nm/s, $p_{tot}$ pressure should be larger than 2 Pa (15 mTorr). If D=5 cm, and DR is larger than 1 nm/s, $p_{tot}$ pressure should be larger than 1 Pa (8 mTorr). If D=10 cm, and DR is larger than 1 nm/s, $p_{tot}$ pressure should be larger than 0.8 Pa (6 mTorr). If D=10 cm, and DR is larger than 5 nm/s, $p_{tot}$ pressure should be larger than 1 Pa (8 mTorr).

In some cases a negative bias can be applied to the substrate. The bias increases mobility of deposited atoms on the substrate surface. The semiconductor and oxide layer is sputtered with the bias that is less than 400 Volts (V). In many instances, the bias can be below 200 V. In addition, the semiconductor and oxide layer can be sputtered in the presence of at least one of the gasses argon (Ar), krypton (Kr) and xenon (Xe). The semiconductor and oxide layer can be sputtered in a reactive environment that, in addition to one or more of Ar, Kr and Xe, can also contain oxygen ($O_2$), nitrogen ($N_2$), hydrogen (H), hydrogen sulfide ($H_2S$), and hydrogen selenide ($H_2Se$). The semiconductor and oxide layer can be sputtered from a single target including both semiconductor and oxide materials, or co-sputtered at the same time from two or more different targets. The semiconductor and oxide layer can be also annealed in $CdCl_2$ vapors.

Figure 10A:
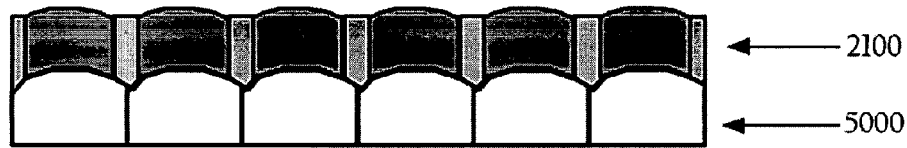
FIGS. 10a to 10d provide example composite layer configurations, including seed layers and interlayers, that may be used in photovoltaic cells of the present invention.
Figure 10B:
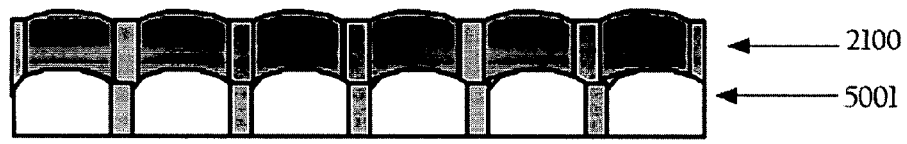

As mentioned above, in order to obtain surface roughness that can improve oxide segregation, an interlayer can be sputtered prior to sputtering the semiconductor and oxide layer. The presence of the interlayer can improve crystallographic growth of the semiconductor and oxide layer and narrow the diameter distribution of semiconductor grains. FIGS. 10a and 10b illustrate different possible interlayer structures that can be formed. FIG. 10a shows the semiconductor and oxide layer 2100 and an interlayer 5000. Interlayer 5000 may include 1) one or more metallic layers, 2) one or more semiconductor layers, or 3) one or more oxide layers. Alternatively, FIG. 10b shows semiconductor and oxide layer 2100 and an interlayer 5001 that comprises one or more layers of a metal and an oxide material, where the oxide is dispersed at grain boundaries of the metal.

Suitable metals for the interlayer 5000 or 5001 include Al, Ti, V, Cr, Mn, Fe, Co, Ni, Cu, Zr, Nb, Mo, Ru, Rh, Pd, Ag, Hf, Ta, W, Re, Ir, and Au. Suitable semiconductors for the interlayer 5000 or 5001 include Si, Ge, Sn, $\beta$-FeSi$_2$, InSb, InAs, InP, GaP, GaAs, GaSb, AlSb, SiC, Te, ZnSb, HgTe, PbS, PbSe, PbTe, CdS, CdSe, CdTe, ZnS, ZnSe, ZnTe, SnTe, Cu$_{1-x}$S (x=1 to 2), Cu$_{1-x}$Se (x=1 to 2), CuInS$_2$, CuGaS$_2$, Cu(In$_{1-x}$Ga$_x$)S$_2$ (x=0 to 1), CuInSe$_2$, CuGaSe$_2$, Cu(In$_{1-x}$Ga$_x$)Se$_2$ (x=0 to 1)), (Cu$_{1-x}$Ag$_x$)(In$_{1-y}$Ga$_y$)S$_2$ (x=0 to 1, y=0 to 1), (Cu$_{1-x}$Ag$_x$)(In$_{1-y}$Ga$_y$)Se$_2$ (x=0 to 1, y=0 to 1), In$_2$S$_3$, In$_2$Se$_3$, AlN, InN, GaN, Bi$_2$S$_3$, Sb$_2$S$_3$, Ag$_2$S, WS$_2$, WSe$_2$, MoS$_2$, MoSe$_2$, SnS$_x$ (x=1 to 2), SnSe$_x$ (x=1 to 2), Cu$_4$SnS$_4$. Suitable oxide materials for the interlayer 5000 or 5001 include magnesium (Mg) oxide, aluminum (Al) oxide, silicon (Si) oxide, titanium (Ti) oxide, vanadium (V) oxide, chromium (Cr) oxide, manganese (Mn) oxide, iron (Fe) oxide, cobalt (Co) oxide, nickel (Ni) oxide, copper (Cu) oxide, zinc (Zn) oxide, gallium (Ga) oxide, germanium (Ge) oxide, selenium (Se) oxide, yttrium (Y) oxide, zirconium (Zr) oxide, niobium (Nb) oxide, molybdenum (Mo) oxide, indium (In) oxide, tin (Sn) oxide, antimony (Sb) oxide, tellurium (Tl) oxide, hafnium (Hf) oxide, tantalum (Ta) oxide, tungsten (W) oxide, mercury (Hg) oxide, lead (Pb) oxide, and bismuth (Bi) oxide. The interlayer can sputtered with a magnetron sputtering technique, where the sputtering conditions comprise one or more of 1) a total atmospheric pressure of at least 0.8 Pa (6 mTorr), 2) an applied bias to the substrate of less than 400 V, and 3) a substrate temperature of below 200 C. The interlayer can be also first sputtered at a total atmospheric pressure below 0.8 Pa (6 mTorr), and then sputtered at a total atmospheric pressure above 1.6 Pa (12 mTorr) to achieve columnar growth of interlayer grains and to promote growth of semiconductor grains on top of the interlayer grains with oxide segregating to semiconductor grain boundaries. Sputtering can be performed in at least one of the gasses, Ar, Kr and Xe. Sputtering can be also performed in a reactive environment that also contains oxygen (O$_2$), nitrogen (N$_2$), hydrogen (H), hydrogen sulfide (H$_2$S), and hydrogen selenide (H$_2$Se). The interlayer can be subsequently annealed in an environment that contains argon (Ar), krypton (Kr), xenon (Xe), oxygen (O$_2$), nitrogen (N$_2$), hydrogen (H), hydrogen sulfide (H$_2$S), hydrogen selenide (H$_2$Se) and/or CdCl$_2$ vapors.

Figure 10C:
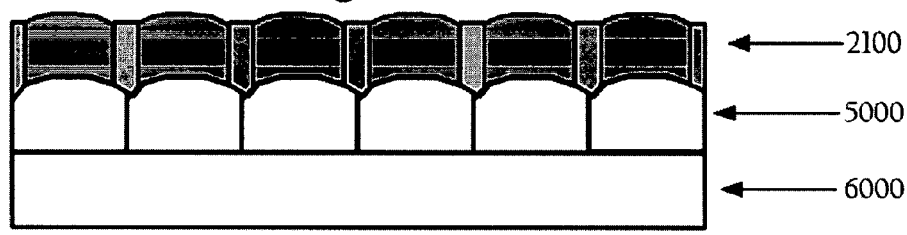
Figure 10D:
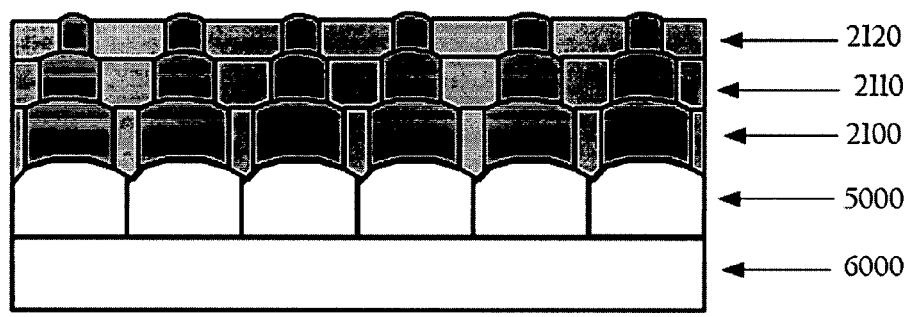

In order to further improve growth of the interlayer and therefore the semiconductor and oxide layer 2100, a seed layer 6000 can be sputtered on the substrate before sputtering the interlayer 5000 (see FIGS. 10c and 10d). A method of manufacturing the semiconductor and oxide layer can comprise sputter depositing the seed layer 6000 with a magnetron sputtering technique at a total atmospheric pressure less than 0.8 Pa (6 mTorr) and a substrate temperature below 200 C, and then sputter depositing the interlayer 5000 under conditions including a total atmospheric pressure of at least 1.3 Pa (10 mTorr), an applied substrate bias less than 400 V, and a substrate temperature less than 150 C. The method may further comprise sputter depositing a semiconductor and oxide layer 2100 under conditions including a total atmospheric pressure of at least 1.3 Pa (10 mTorr), an applied substrate bias less than 200 V, and a substrate temperature below 150 C. The foregoing is only intended to be illustrative. Other process conditions can also be used.

Sputtering of seed layer 6000 can be performed in at least one of the gasses, Ar, Kr and Xe. Sputtering can be also performed in the reactive environment that also contains oxygen (O$_2$), nitrogen N$_2$), hydrogen (H), hydrogen sulfide (H$_2$S), and hydrogen selenide (H$_2$Se) with a total sputtering pressure lower than 1.3 Pa (10 mTorr). During the sputtering of the seed layer 6000 a bias voltage may be applied to the substrate to increase mobility of deposited atoms while growing the seed layer to yield a smooth layer surface that promotes desired growth and structure of the interlayer 5000.

A benefit of the high pressure sputtering processes described herein is the formation of semiconductor grains separated by an oxide matrix. This microstructure is desired in solar cells where semiconductor grains inject electrons in the conductive band of an oxide and/or an n-type semiconductor material, and inject holes in the valence band of a hole conducting material. Relaxation rates of hot carriers are very fast in bulk semiconductors. However, the rate can be slowed if semiconductor grain diameter is reduced below about 10 to 20 nm. This allows the extraction of hot carriers before they can relax to the band edge (and/or generation of two or more electron-hole pairs from a single photon), increasing the efficiency of the photon conversion in nanometer-sized semiconductor absorbers. The high pressure sputtering process can be used to produce semiconductor grains with the average diameter below 10 nm. The average semiconductor grain diameter can be controlled by varying one or more of 1) sputtering pressure of the seed layer, interlayer and/or the semiconductor and oxide layer, 2) the thickness of the seed layer and the interlayer, and 3) the ratio between the semiconductor and oxide volume fraction in the semiconductor and oxide layer. Furthermore, the shape of the semiconductor grains can be controlled using a high pressure sputtering process. By changing the semiconductor and oxide layer thickness, for example, the shape of the semiconductor grains can be varied from that of a thin to that of thick cylindrical like shape.

As FIG. 10d illustrates, the high pressure sputtering method can also be used to create a composite semiconductor and oxide layer having multiple sub-layers 2100, 2110, and 2120 ("SOL sub-layer"). One or more characteristics of each semiconductor and oxide layer may be varied to achieve desired results, such as varying semiconductor grain diameter and height (achieved by varying the semiconductor and oxide layer thickness) to vary the resulting band gap of the semiconductor grains. For example, each SOL sub-layer may contain the same or different semiconductor materials. Each SOL sub-layer may contain the same or different oxide materials. In addition the ration between the semiconductor and oxide volume fraction can be varied across the layers.

The described flexibility of the process is quite advantageous for solar cells because it allows varying the band gap, $E_g$, of semiconductor grains in each SOL sub-layer. For example, assume that semiconductor and oxide absorption layers 2100, 2110, 2120 in a solar cell are designed as shown in FIG. 10d and that solar illumination enters from the top of the layer structure. To increase efficiency of the solar cell, energy or band gap, $E_g$, of semiconductor grains can be varied from a larger value in the top sub-layer 2120 to a smaller value in the bottom sub-layer 2100. The band gap can be varied between about 0.5 to 3 eV to capture or take advantage of a broader spectrum of light energy. The band gap, $E_g$, of semiconductor grains can be varied by changing the diameter and the height of the semiconductor grains in the SOL sub-layers and/or by changing the composition of the semiconductor grains. The band gap of each layer can be step wise varied over a range of the solar spectrum to achieve a high-efficiency cell.

FIG. 11 illustrates a possible solar cell structure that may be constructed with the semiconductor and oxide layer(s), as well as seed layer 6000 and interlayer 5000, disposed between an electron conducting layer 1000 and a hole conducting layer 3000. Electric contacts (such as transparent conductive layers, metal grids and layers), non-reflective coatings, and/or protective layers can also be added to the layered structure of the solar cell as described above. Additional example solar cell structures are described below in Section C.

C. Alternative Cell Structures and Configurations

Figure 3A:
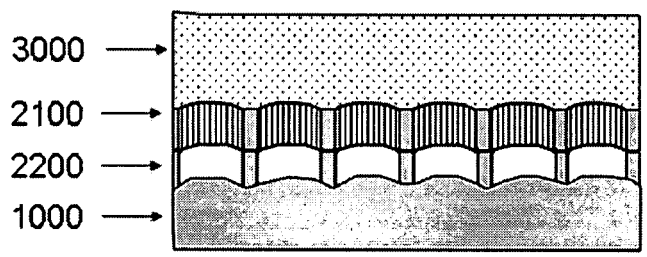
FIGS. 3a to 3d provide example composite photoactive layers that may be used in photovoltaic cells of the present invention.

FIG. 3a shows a solar cell structure according to which is deposited in overlying sequence, an oxide material or n-type semiconductor layer 1000, a metal and oxide layer 2200, a semiconductor and oxide layer 2100, a p-type semiconductor or other hole conducting material layer 3000. As mentioned above, layers 1000, 2200 and 2100 can be deposited with a magnetron sputtering technique at a total atmospheric pressure of at least 1.2 Pa (10 mTorr). Oxide material or n-type semiconductor layer 1000 can be also first sputtered at a total atmospheric pressure below 0.8 Pa (6 mTorr), and then sputtered at a total atmospheric pressure above 1.6 Pa (12 mTorr) to form an interlayer to promote desired growth of metal grains of the metal and oxide layer 2200. Hole conducting material layer 3000 can sputtered at a total atmospheric pressure below 1.2 Pa (10 mTorr).

Figure 3B:
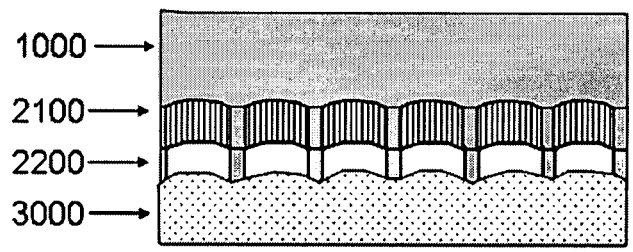

FIG. 3b illustrates a cell structure according to which is deposited, in overlying sequence, a p-type semiconductor or other hole conducting material layer 3000, a metal and oxide layer 2200, a semiconductor and oxide layer 2100, and an oxide material or n-type semiconductor layer 1000. Layers 3000, 2200 and 2100 can be deposited with a magnetron sputtering technique at a total atmospheric pressure of at least 1.2 Pa (10 mTorr). Layer 3000 can be also be first sputtered at a total atmospheric pressure below 0.8 Pa (6 mTorr) and then sputtered at a total atmospheric pressure above 1.6 Pa (12 mTorr) to form an interlayer having a desired surface roughness that promotes growth of metal grains of the metal and oxide layer 2200. Layer 1000 can be sputtered at a total atmospheric pressure below 1.2 Pa (10 mTorr).

Figure 3C:
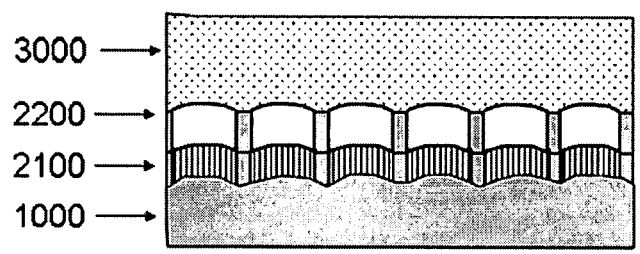

FIG. 3c illustrates a cell structure in which are deposited, in overlying sequence, an oxide material or n-type semiconductor layer 1000, a semiconductor and oxide layer 2100, a metal and oxide layer 2200, and a p-type semiconductor or other hole conducting material layer 3000. Layers 1000, 2200 and 2100 can deposited with a magnetron sputtering technique at a total atmospheric pressure of at least 1.2 Pa (10 mTorr). Layer 1000 can be also first sputtered at a total atmospheric pressure below 0.8 Pa (6 mTorr), and then sputtered at a total atmospheric pressure above 1.6 Pa (12 mTorr) to yield desired surface properties. Layer 3000 can be sputtered at a total atmospheric pressure below 1.2 Pa (10 mTorr).

Figure 3D:
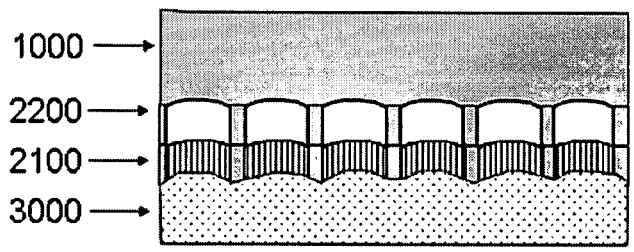

FIG. 3d shows a cell structure in which are deposited, in overlying sequence, a p-type semiconductor or other hole conducting material layer 3000, semiconductor and oxide layer 2100, metal and oxide layer 2200, an oxide material or n-type semiconductor layer 1000. Layers 3000, 2200 and 2100 can be deposited with a magnetron sputtering technique at a total atmospheric pressure of at least 1.2 Pa (10 mTorr). Layer 3000 can be also first sputtered at a total atmospheric pressure below 0.8 Pa (6 mTorr) and then sputtered at a total atmospheric pressure above 1.6 Pa (12 mTorr). Layer 1000 can be sputtered at a total atmospheric pressure below 1.2 Pa (10 mTorr).

Figure 4A:
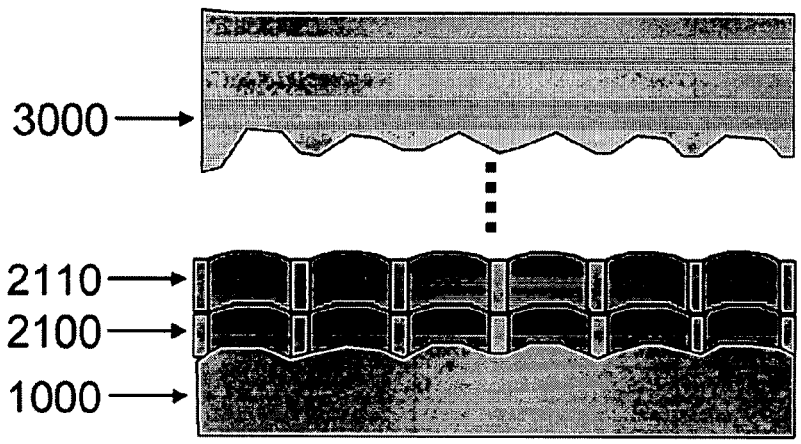
FIGS. 4a to 4j provide example composite photoactive layers that may be used in photovoltaic cells of the present invention.

FIG. 4a provides a cell structure in which are deposited, in overlying sequence, an oxide material or n-type semiconductor layer 1000, two or more semiconductor and oxide layers (2100, 2110, . . . 21n0), and p-type semiconductor or other hole conducting material layer 3000. As discussed above, the variable n refers to a layer number. The composition of semiconductor material in layers 2100, 2110, . . . , 21n0 can be varied to vary the band gap of semiconductor material and increase efficiency of the solar cell. For example, the semiconductor of layer 2100 can be different from the semiconductor of layer 2110. Layers 1000, 2100, 2110, . . . , 21n0 can be deposited with a magnetron sputtering technique at a total atmospheric pressure of at least 1.2 Pa (10 mTorr). Layer 1000 can be also first sputtered at a total atmospheric pressure below 0.8 Pa (6 mTorr) and then sputtered at a total atmospheric pressure above 1.6 Pa (12 mTorr) as discussed above. Layer 3000 can be sputtered at a total atmospheric pressure below 1.2 Pa (10 mTorr).

Figure 4B:
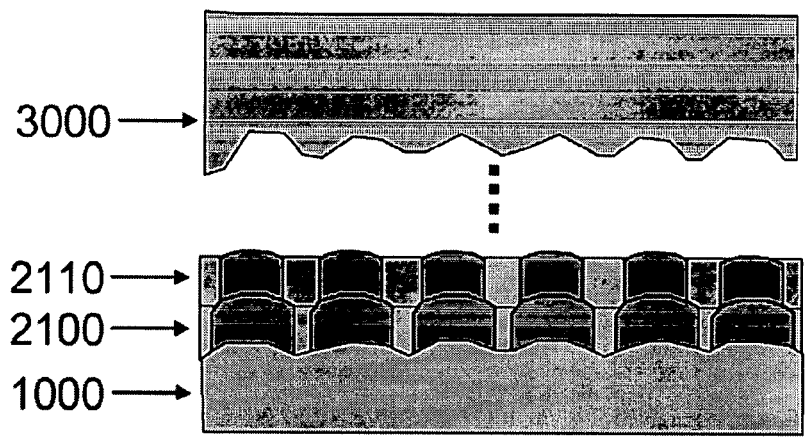
Figure 4C:
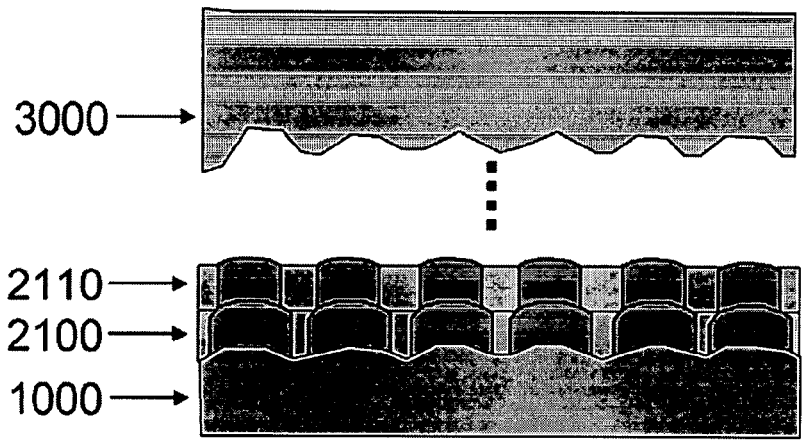
Figure 4D:
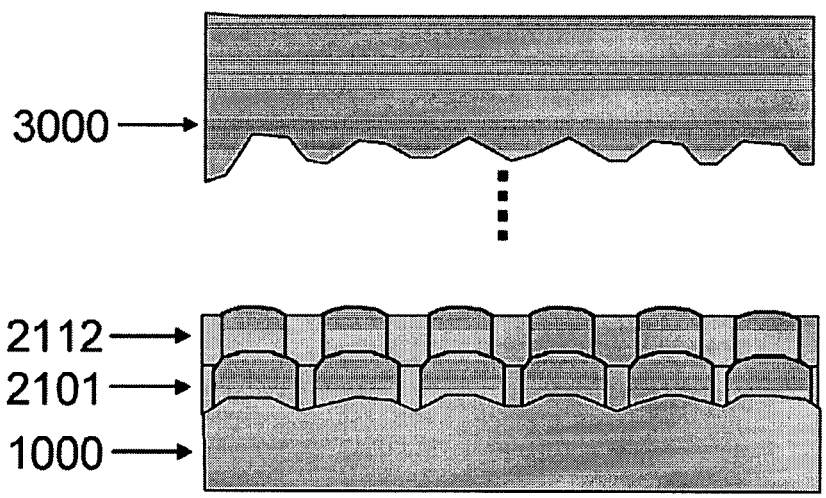
Figure 4E:
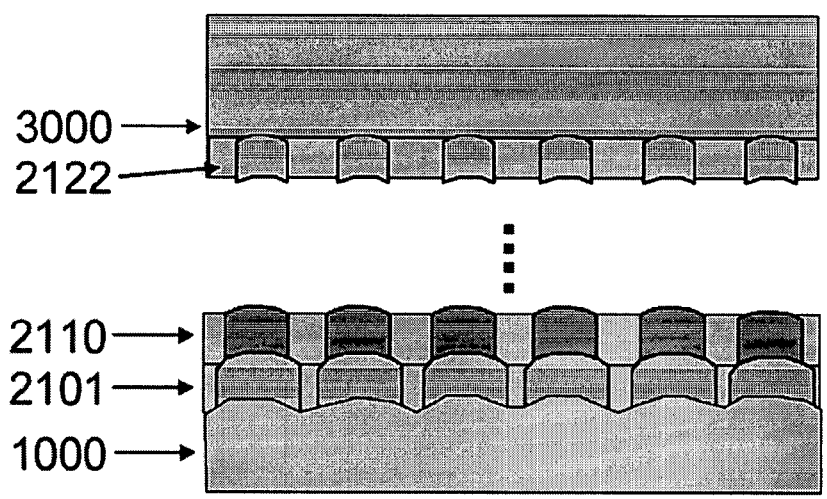
Figure 4F:
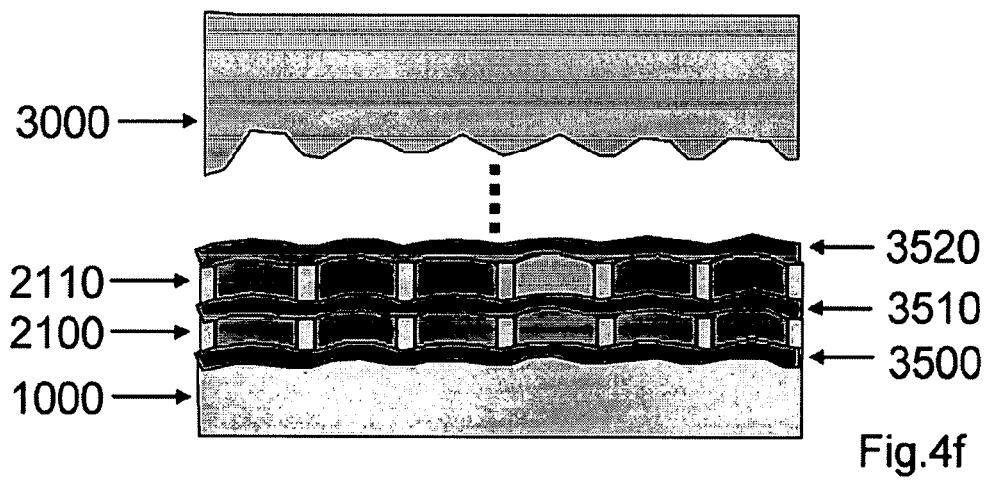
Figure 4G:
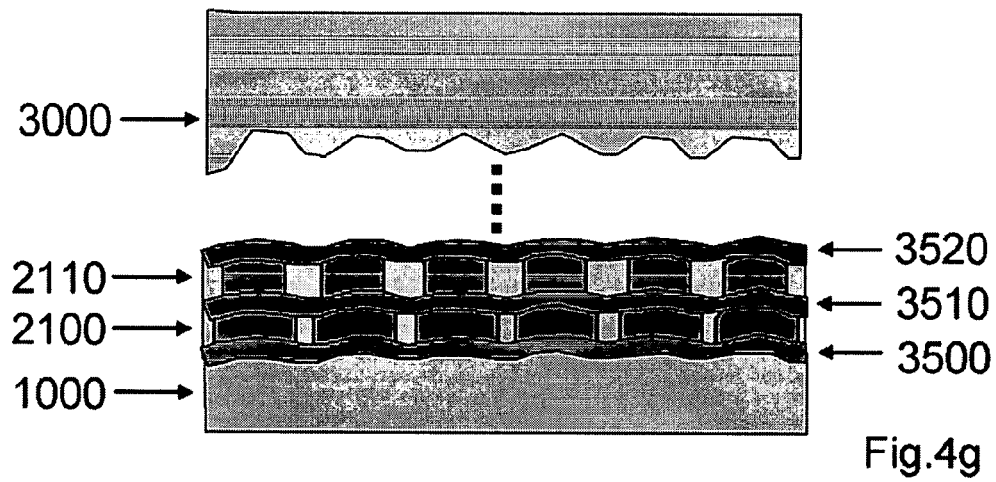
Figure 4H:
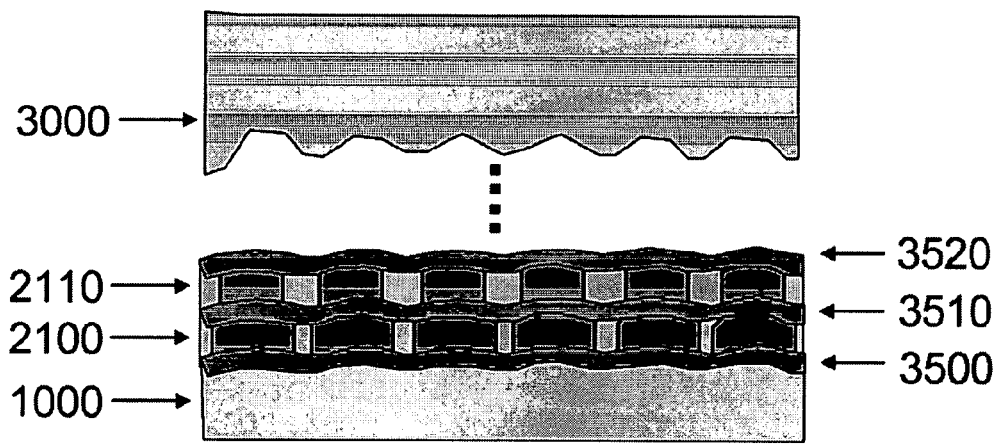

FIG. 4b shows a cell structure in which are deposited, in overlying sequence, an oxide material or n-type semiconductor layer 1000, two or more semiconductor and oxide layers 2100, 2110, . . . , 21n0, a p-type semiconductor or other hole conducting material 3000. The size (diameter and/or height) of semiconductor grains in layers 2100, 2110, . . . , 21n0 can be varied to vary the band gap of semiconductor material and increase photovoltaic efficiency of this structure. In a particular implementation, the size of the semiconductor grains in the first layer 2100 is the largest (relative to all other semiconductor and oxide layers), with semiconductor grain size decreasing with each successive layer. Layers 1000, 2100, 2110, . . . , 21n0 can be deposited with a magnetron sputtering technique at a total atmospheric pressure of at least 1.2 Pa (10 mTorr). Layer 1000 can be also first sputtered at a total atmospheric pressure below 0.8 Pa (6 mTorr) and then sputtered at a total atmospheric pressure above 1.6 Pa (12 mTorr). Layer 3000 can sputtered at a total atmospheric pressure below 1.2 Pa (10 mTorr). Similarly, FIG. 4c illustrates a cell structure in which are deposited, in overlying sequence, an oxide material or n-type semiconductor layer 1000, two or more semiconductor and oxide layers 2100, 2110, . . . , 21n0, a p-type semiconductor or other hole conducting material 3000. The size of the semiconductor grains and the composition of the semiconductor grains in layers 2100, 2110, . . . , 21n0 can be varied to vary the band gap of semiconductor material and increase photovoltaic efficiency. In any of the foregoing configurations, an intervening layer (3500, 3510, . . . , 35(n+1)0), such as a thin layer of oxide, may be deposited between each of the semiconductor and oxide layers 2100, 2110, . . . , 21n0 to isolate the semiconductor grains as shown in FIGS. 4f, 4g, and 4h. The thickness of layers 3500, 3510, . . . , 35(n+1)0 can be up to 200 nm. In one implementation, the thickness of layers 3500, 3510, . . . , 35(n+1)0 is up to 20 nm.

Figure 4I:
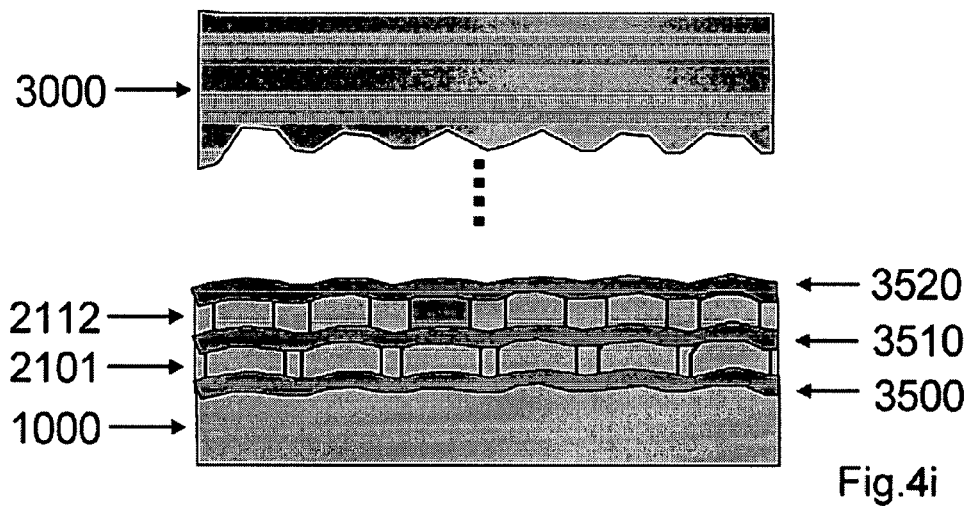
Figure 4J:
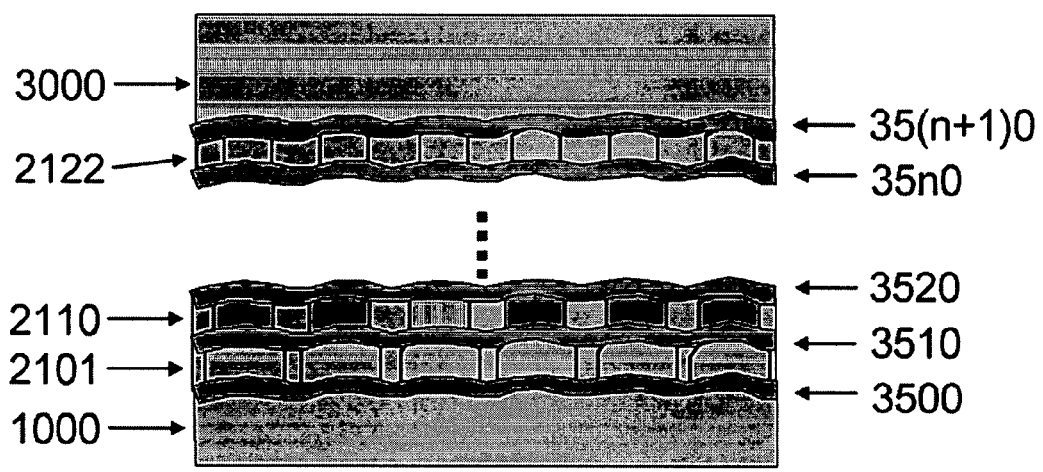
Figure 6A:
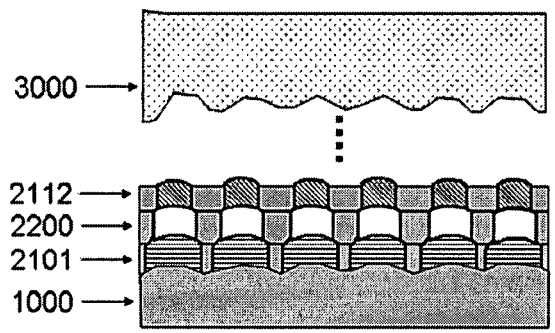
FIGS. 6a to 6d provide example composite photoactive layers that may be used in photovoltaic cells of the present invention.

In some particular implementations, solar cell structures including semiconductor and oxide layers where the semiconductor material (or grain) is a p-type semiconductor or an n-type semiconductor can also be constructed. FIG. 4d, for example, illustrates a cell structure in which are deposited, in overlying sequence, an oxide material or n-type semiconductor layer 1000, n-type semiconductor and oxide layer 2101, p-type semiconductor and oxide layer 2112, and semiconductor or other hole conducting material layer 3000. Seed layers and interlayers may also be disposed between layer 1000 and n-type semiconductor and oxide layer 2101. In addition, one or more intrinsic semiconductor and oxide layers 2110 (see FIG. 4e) can be disposed between the n-type semiconductor and oxide layer 2101 and p-type semiconductor and oxide layer 2122. In any of the foregoing configurations, an intervening layer (3500, 3510, . . . , 35(n+1)0), such as a thin layer of oxide, may be deposited between each of the semiconductor and oxide layers 2101, 2110, . . . , 2112 to isolate the semiconductor grains as shown in FIGS. 4i, and 4j. The size (diameter and/or height) and/or composition of the semiconductor grains of one or more of these semiconductor and oxide layers 2101, 2110, 2112, etc. can be varied to vary band gap of semiconductor material and increase photovoltaic efficiency. As FIG. 6a illustrates, one or more metal and oxide layers 2200 may be disposed between the n-type semiconductor and oxide layer 2101 and p-type semiconductor and oxide layer 2112.

Figure 5A:
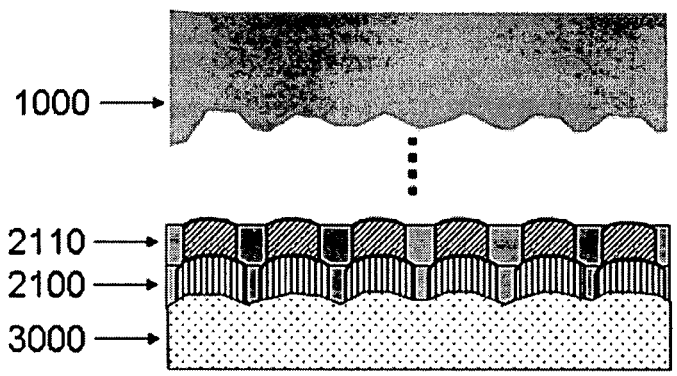
FIGS. 5a to 5c provide example composite photoactive layers that may be used in photovoltaic cells of the present invention.
Figure 5B:
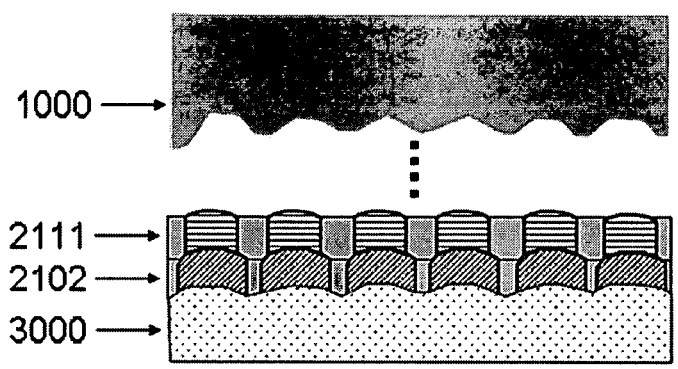
Figure 5C:
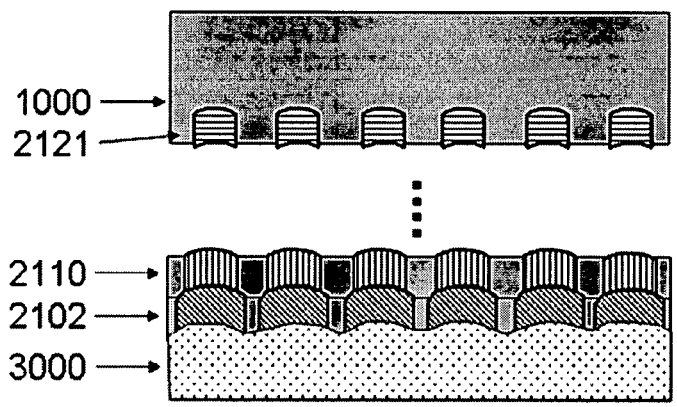

Still further, as FIGS. 5*a* to 5*c* provide, the hole conducting material layer 3000 may be deposited before the electron conducting material layer 1000 and intervening layers. FIG. 5*a*, for example, provides a cell structure in which are deposited, in overlying sequence, a p-type semiconductor or other hole conducting material layer 3000, two or more semiconductor and oxide layers 2100, 2110, . . . 21*n*0, and an oxide material or n-type semiconductor 1000 layer. The diameter and height of semiconductor grains and the composition of semiconductor grains in layers 2100, 2110, . . . 21*n*0 can be varied to vary band gap of the semiconductor material and increase efficiency. As mentioned before, layers 3000, 2100, 2110, . . . 21*n*0 can be deposited with a magnetron sputtering technique at a total atmospheric pressure of at least 1.2 Pa (10 mTorr). Layer 3000 can be also first sputtered at a total atmospheric pressure below 0.8 Pa (6 mTorr) and then sputtered at a total atmospheric pressure above 1.6 Pa (12 mTorr). Layer 1000 can be sputtered at a total atmospheric pressure below 1.2 Pa (10 mTorr).

Figure 6B:
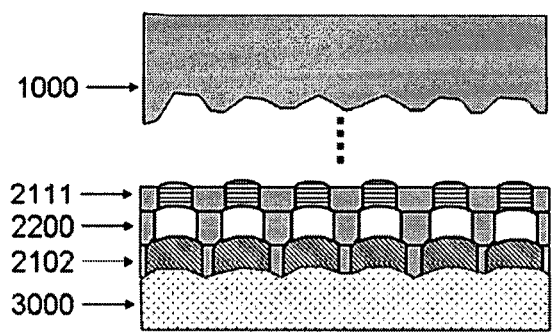

FIG. 5*b* shows a cell structure in which are deposited, in overlying sequence, a p-type semiconductor or other hole conducting material layer 3000, p-type semiconductor and oxide layer 2102, n-type semiconductor and oxide layer 2111, and an oxide material or n-type semiconductor 1000. In addition, one or more intrinsic semiconductor and oxide layers 2110 (see FIG. 5*c*) can be disposed between the p-type semiconductor and oxide layer 2102 and n-type semiconductor and oxide layer 2121. The size (diameter and/or height) and/or composition of the semiconductor grains of one or more of these semiconductor and oxide layers 2102, 2121, etc. can be varied to vary band gap of semiconductor material and increase photovoltaic efficiency. In addition, as FIG. 6*b* illustrates, one or more metal and oxide layers 2200 may be disposed between the p-type semiconductor and oxide layer 2102 and n-type semiconductor and oxide layer 2111.

Figure 6C:
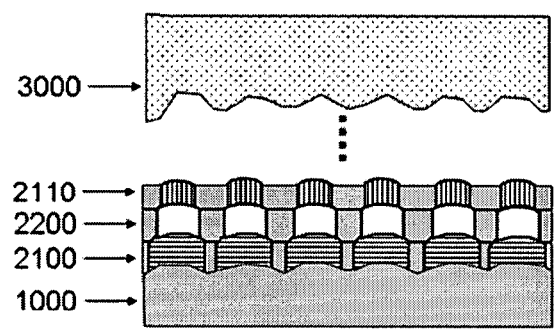
Figure 6D:
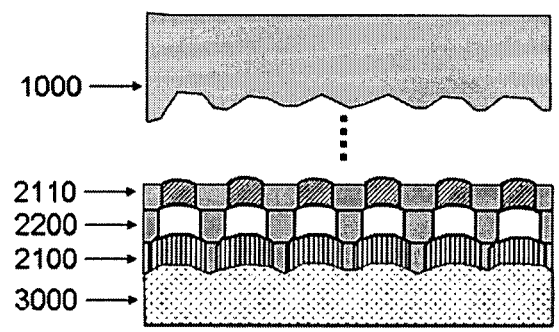

Still further, one or more metal and oxide layers 2200 may be disposed between intrinsic semiconductor and oxide layers. FIG. 6*c* shows a cell structure in which are deposited, in overlying sequence, an oxide material or n-type semiconductor layer 1000, one or more sub-structures where each sub-structure consists of semiconductor and oxide layer 2100, metal and oxide layer 2200 and semiconductor and oxide layer 2110, and a p-type semiconductor or other hole conducting material layer 3000. The size (diameter and/or height) of semiconductor grains and the composition of semiconductor grains in layers can be varied to vary band gap of semiconductor material and increase efficiency. Similarly, FIG. 6*d* illustrates a similar cell structure in which p-type semiconductor or other hole conducting material layer 3000 is deposited prior to electron conducting layer 1000.

Figure 7A:
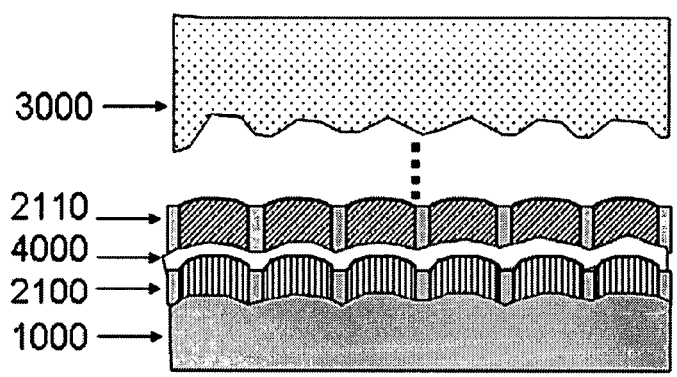
FIGS. 7a to 7b provide example composite photoactive layers that may be used in photovoltaic cells of the present invention.
Figure 7B:
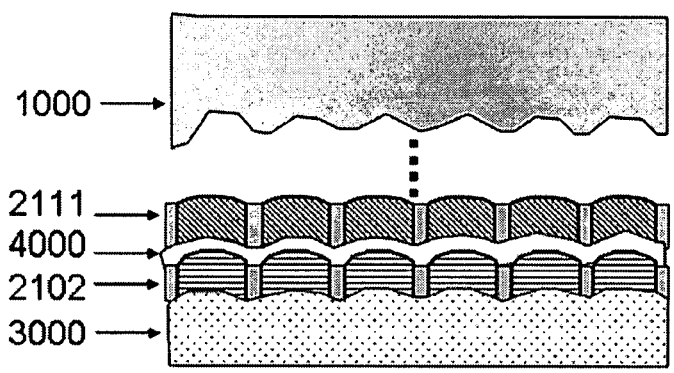

A variety of other configurations are possible. For example, FIGS. 7*a* and 7*b* illustrate cell structures in which a metallic layer 4000 can be disposed between semiconductor and oxide layers, such as between intrinsic semiconductor and oxide layers 2100 and 2110 (FIG. 7*a*), or between p-type semiconductor and oxide layer 2102 and n-type semiconductor and oxide layer 2111.

Figure 12A:
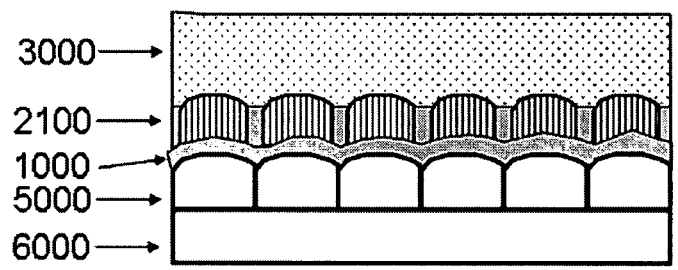
FIGS. 12a to 12d provide additional example composite layer configurations that that may be used in photovoltaic cells of the present invention.
Figure 12B:
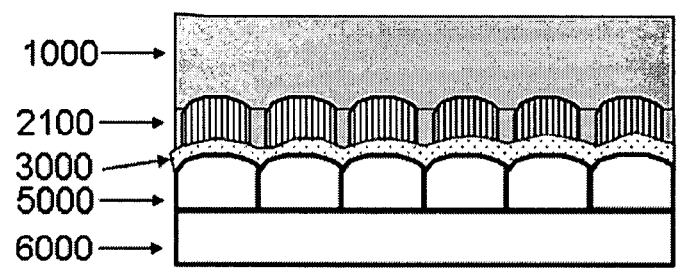

Still further, FIGS. 12*a* to 12*d* illustrate additional photo cell configurations. FIG. 12*a* shows a cell structure in which are deposited, in overlying sequence, a seed layer 6000, an interlayer 5000, an electron conducting material layer 1000, a semiconductor and oxide layer 2100, and a p-type semiconductor or other hole conducting material layer 3000. As mentioned before, layers 1000 and 2100 can be deposited with a magnetron sputtering technique at a total atmospheric pressure of at least 1.2 Pa (10 mTorr). A layer 3000 can be sputtered at a total atmospheric pressure below 1.2 Pa (10 mTorr). Similarly, as FIG. 12*b* shows, the hole conducting material layer can be deposited on interlayer 5000, while electron conducting material layer 1000 can be deposited on semiconductor and oxide layer 2100.

Figure 12C:
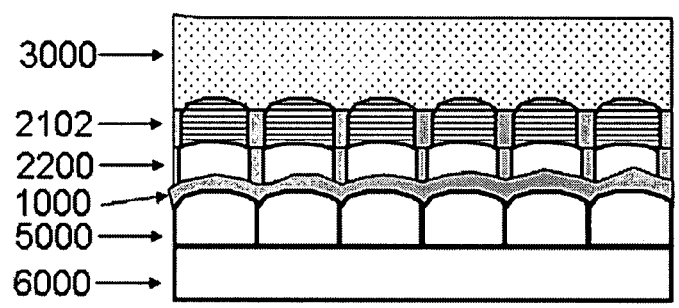
Figure 12D:
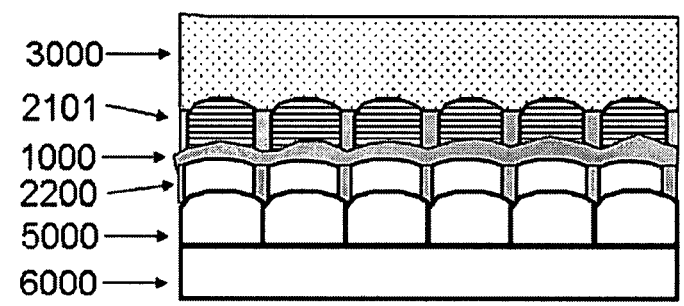

FIG. 12*c* shows a cell structure in which are deposited, in overlying sequence, a seed layer 6000, an interlayer 5000, an electron conducting layer 1000, a metal and oxide layer 2200, a p-type semiconductor and oxide layer 2102, p-type semiconductor or other hole conducting material layer 3000. As mentioned before, layers 1000, 2200 and 2102 can be deposited with a magnetron sputtering technique at a total atmospheric pressure of at least 1.2 Pa (10 mTorr). Hole conducting material layer 3000 can be sputtered at a total atmospheric pressure below 1.2 Pa (10 mTorr). Similarly, FIG. 12*d* shows a cell structure in which are deposited, in overlying sequence, a seed layer 6000, an interlayer 5000, a metal and oxide layer 2200, an electron conducting material layer 1000, an n-type semiconductor and oxide layer 2101, and a p-type semiconductor or other hole transporting material layer 3000. The illustrated layer structures of FIGS. 12*a* to 12*d* can be combined with additional conductive contacts or layers, protective layers and the like as illustrated above.

In other implementations, tandem solar cells can be constructed utilizing one or more semiconductor and oxide layers. FIG. 13*a* illustrates a cell structure according to which is deposited, in overlying sequence, an electron conducting material layer 1000, and one or more composite layer structures including an n-type semiconductor and oxide layer 2101, a p-type semiconductor and oxide layer 2112, and an electron conducting material layer 1000. The illustrated cell structure also includes an n-type semiconductor and oxide layer 21*n*1, a p-type semiconductor and oxide layer 21($n$+1)2, and a hole conducting material layer 3000. FIG. 13*b* illustrates a cell structure according to which is deposited, in overlying sequence, an electron conducting material layer 1000, a p-type semiconductor and oxide layer 2102, an interconnecting layer 3600, a n-type semiconductor and oxide layer 2111, and a hole conducting material layer 3000.

FIG. 14*a* illustrates a cell structure according to which is deposited, in overlying sequence, an electron conducting material layer 1000, and one or more composite layer structures including an n-type semiconductor and oxide layer 2101, a p-type semiconductor and oxide layer 2112, and an interconnecting layer 3600. The illustrated cell structure also comprises an n-type semiconductor and oxide layer 21*n*1, a p-type semiconductor and oxide layer 21($n$+1)2, and a hole conducting material layer 3000. A cell structure illustrated in FIG. 14*b* also includes intrinsic semiconductor and oxide layers 21X0 deposited between n-type and p-type semiconductor and oxide layers of the composite layer structures.

An interconnecting layer 3600 may include one or more oxide (of particular interest are conductive oxides such as indium-tin-oxide and doped zinc oxide) or semiconductor layers. The interconnecting layer 3600 can be up to 200 nm in thickness. In one implementation, the interconnecting layer is about 20 nm or less in thickness. The role of the interconnecting layer 3600 is to connect sub-cells (p-n junctions). Preferably, the inter-cell ohmic contacts should cause very low loss of electrical power between cells. Therefore, the interconnecting layer 3600 should have minimal electrical resistance. For this reason interconnecting layer can be metal, conductive oxide layer, and a tunnel junction (or tunnel diodes). The metal interconnects can provide low electrical resistance, but they are difficult to fabricate and they strongly absorb light that can cause substantial loss in the device efficiency. Therefore, conductive oxide layers, tunnel junctions (or tunnel diodes) are preferred. The material used for interconnecting layer 3600 should have low resistivity, low optical energy losses, and often crystallographic compatibility through lattice-matching between top and bottom cell.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention. Only the preferred embodiments of the present invention and but a few examples of its versatility are shown and described in the present disclosure. It is to be understood that the present invention is capable of use in various other combinations and is susceptible of changes and/or modifications within the scope of the inventive concept as expressed herein.

What is claimed is:

1. A photovoltaic cell, comprising:
   one or more overlying electron-conducting layers each comprising one or more electron-conducting materials;
   one or more overlying hole-conducting layers each comprising one or more hole-conducting materials;
   one or more overlying photoactive conversion layers, each of the overlying photoactive conversion layers being disposed between the one or more overlying electron-conducting layers and the one or more overlying hole-conducting layers, each of the photoactive conversion layers comprising one or more distinct overlying semiconductor and oxide layers, each semiconductor and oxide layer comprising a multiplicity of semiconductor grains arranged in a distinct oxide matrix, wherein each of the semiconductor grains is substantially columnar, wherein each of the semiconductor grains has a height substantially equal to that of a thickness of the respective distinct semiconductor and oxide layer, wherein the oxide matrix is dispersed at least at circumferential grain boundaries of the semiconductor grains; and wherein each of one or more of the overlying photoactive conversion layers comprises:
   one or more overlying n-type semiconductor and oxide layers, each n-type semiconductor and oxide layer comprising a multiplicity of n-type semiconductor grains arranged in an oxide matrix, wherein each of the n-type semiconductor grains is substantially columnar, wherein each of the n-type semiconductor grains has a height substantially equal to that of a thickness of the respective n-type semiconductor and oxide layer, and wherein the oxide matrix is dispersed at least at circumferential grain boundaries of the n-type semiconductor grains; and/or
   one or more overlying p-type semiconductor and oxide layers, each p-type semiconductor and oxide layer comprising a multiplicity of p-type semiconductor grains arranged in an oxide matrix, wherein each of the p-type semiconductor grains is substantially columnar, wherein each of the p-type semiconductor grains has a height substantially equal to that of a thickness of the respective p-type semiconductor and oxide layer, and wherein the oxide matrix is dispersed at least at circumferential grain boundaries of the p-type semiconductor grains;
   a substrate, wherein:
     the one or more overlying electron-conducting layers are deposited over the substrate, the one or more photoactive conversion layers are deposited over the one or more overlying electron-conducting layers, and the one or more overlying hole-conducting layers are deposited over the one or more photoactive conversion layers; or
     the one or more overlying hole-conducting layers are deposited over the substrate, the one or more photoactive conversion layers are deposited over the one or more overlying hole-conducting layers, and the one or more overlying electron-conducting layers are deposited over the one or more photoactive conversion layers;
   one or more electrically conducting interlayers that promote vertical columnar growth of semiconductor grains from an adjacent semiconductor and oxide layer respectively during deposition of the adjacent layers;
   one or more metal and oxide layers, each of the one or more metal and oxide layers being disposed between the one or more overlying electron-conducting layers and the one or more overlying hole-conducting layers, each of the metal and oxide layers comprising a multiplicity of metallic grains arranged in an oxide matrix, wherein each of the metallic grains is substantially columnar, wherein each of the metallic grains has a height substantially equal to that of a thickness of the respective metal and oxide layer, and wherein the oxide matrix is dispersed at least at circumferential grain boundaries of the metallic grains and wherein one or more of the metal and oxide layers are disposed between:
     the one or more overlying n-type semiconductor and oxide layers and the one or more overlying p-type semiconductor and oxide layers within a respective photoactive conversion layer;
     adjacent photoactive conversion layers of the one or more photoactive conversion layers; the one or more overlying electron-conducting layers and the one of the one or more photoactive conversion layers most closely disposed in proximity to the one or more overlying electron-conducting layers; and/or
     the one or more overlying hole-conducting layers and the one of the one or more photoactive conversion layers most closely disposed in proximity to the one or more overlying hole-conducting layers.

2. The photovoltaic cell of claim 1, wherein each of substantially most or all of the metallic semiconductor grains in one or more of the metal and oxide layers is in contact on one end with a p-type semiconductor grain from an adjacent p-type semiconductor and oxide layer.

3. The photovoltaic cell of claim 1, wherein each of substantially most or all of the metallic semiconductor grains in one or more of the metal and oxide layers is in contact on one end with an n-type semiconductor grain from an adjacent n-type semiconductor and oxide layer.

4. A photovoltaic cell, comprising:
   one or more overlying electron-conducting layers each comprising one or more electron-conducting materials;
   one or more overlying hole-conducting layers each comprising one or more hole-conducting materials;
   one or more overlying photoactive conversion layers, each of the overlying photoactive conversion layers being disposed between the one or more overlying electron-conducting layers and the one or more overlying hole-conducting layers, each of the photoactive conversion layers comprising one or more distinct overlying semiconductor and oxide layers, each semiconductor and oxide layer comprising a multiplicity of semiconductor grains arranged in a distinct oxide matrix, wherein each of the semiconductor grains is substantially columnar, wherein each of the semiconductor grains has a height substantially equal to that of a thickness of the respective distinct semiconductor and oxide layer, wherein the oxide matrix is dispersed at least at circumferential grain boundaries of the semiconductor grains; and wherein each of one or more of the overlying photoactive conversion layers comprises:

one or more overlying n-type semiconductor and oxide layers, each n-type semiconductor and oxide layer comprising a multiplicity of n-type semiconductor grains arranged in an oxide matrix, wherein each of the n-type semiconductor grains is substantially columnar, wherein each of the n-type semiconductor grains has a height substantially equal to that of a thickness of the respective n-type semiconductor and oxide layer, and wherein the oxide matrix is dispersed at least at circumferential grain boundaries of the n-type semiconductor grains; and/or one or more overlying p-type semiconductor and oxide layers, each p-type semiconductor and oxide layer comprising a multiplicity of p-type semiconductor grains arranged in an oxide matrix, wherein each of the p-type semiconductor grains is substantially columnar along an axis perpendicular to an inter-layer planar surface of the p-type semiconductor and oxide layer, wherein each of the p-type semiconductor grains has a height equal to that of a thickness of the respective p-type semiconductor and oxide layer, and wherein the oxide matrix is dispersed at least at circumferential grain boundaries of the p-type semiconductor grains;

wherein there are a plurality of n-type semiconductor and oxide layers in each of one or more of the photoactive conversion layers, and wherein each of substantially most or all of the n-type semiconductor grains in one of the n-type semiconductor and oxide layers in a respective photoactive conversion layer is positioned over a corresponding n-type semiconductor grain in an immediately adjacent one of the n-type semiconductor and oxide layers in the respective photoactive conversion layer;

a substrate, wherein:
the one or more overlying electron-conducting layers are deposited over the substrate, the one or more photoactive conversion layers are deposited over the one or more overlying electron-conducting layers, and the one or more overlying hole-conducting layers are deposited over the one or more photoactive conversion layers; or the one or more overlying hole-conducting layers are deposited over the substrate, the one or more photoactive conversion layers are deposited over the one or more overlying hole-conducting layers, and the one or more overlying electron-conducting layers are deposited over the one or more photoactive conversion layers; and one or more electrically conducting interlayers that promote vertical columnar growth of semiconductor grains from an adjacent semiconductor and oxide layer respectively during deposition of the adjacent layers.

5. A photovoltaic cell, comprising:
one or more overlying electron-conducting layers each comprising one or more electron-conducting materials;
one or more overlying hole-conducting layers each comprising one or more hole-conducting materials;
one or more overlying photoactive conversion layers, each of the overlying photoactive conversion layers being disposed between the one or more overlying electron-conducting layers and the one or more overlying hole-conducting layers, each of the photoactive conversion layers comprising one or more distinct overlying semiconductor and oxide layers, each semiconductor and oxide layer comprising a multiplicity of semiconductor grains arranged in a distinct oxide matrix, wherein each of the semiconductor grains is substantially columnar, wherein each of the semiconductor grains has a height substantially equal to that of a thickness of the respective distinct semiconductor and oxide layer, wherein the oxide matrix is dispersed at least at circumferential grain boundaries of the semiconductor grains; and wherein each of one or more of the overlying photoactive conversion layers comprises:

one or more overlying n-type semiconductor and oxide layers, each n-type semiconductor and oxide layer comprising a multiplicity of n-type semiconductor grains arranged in an oxide matrix, wherein each of the n-type semiconductor grains is substantially columnar, wherein each of the n-type semiconductor grains has a height substantially equal to that of a thickness of the respective n-type semiconductor and oxide layer, and wherein the oxide matrix is dispersed at least at circumferential grain boundaries of the n-type semiconductor grains; and/or one or more overlying p-type semiconductor and oxide layers, each p-type semiconductor and oxide layer comprising a multiplicity of p-type semiconductor grains arranged in an oxide matrix, wherein each of the p-type semiconductor grains is substantially columnar, wherein each of the p-type semiconductor grains has a height substantially equal to that of a thickness of the respective p-type semiconductor and oxide layer, and wherein the oxide matrix is dispersed at least at circumferential grain boundaries of the p-type semiconductor grains;

wherein there are a plurality of p-type semiconductor and oxide layers in each of one or more of the photoactive conversion layers, and wherein each of substantially most or all of the p-type semiconductor grains in one of the p-type semiconductor and oxide layers in a respective photoactive conversion layer is positioned over a corresponding p-type semiconductor grain in an immediately adjacent one of the p-type semiconductor and oxide layers in the respective photoactive conversion layer;

a substrate, wherein:
the one or more overlying electron-conducting layers are deposited over the substrate, the one or more photoactive conversion layers are deposited over the one or more overlying electron-conducting layers, and the one or more overlying hole-conducting layers are deposited over the one or more photoactive conversion layers; or the one or more overlying hole-conducting layers are deposited over the substrate, the one or more photoactive conversion layers are deposited over the one or more overlying hole-conducting layers, and the one or more overlying electron-conducting layers are deposited over the one or more photoactive conversion layers; and one or more electrically conducting interlayers that promote vertical columnar growth of semiconductor grains from an adjacent semiconductor and oxide layer respectively during deposition of the adjacent layers.

* * * * *